United States Patent
Kouno

(10) Patent No.: US 6,996,692 B2
(45) Date of Patent: Feb. 7, 2006

(54) NONVOLATILE SEMICONDUCTOR MEMORY DEVICE AND METHOD FOR PROVIDING SECURITY FOR THE SAME

(75) Inventor: Kazuyuki Kouno, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 334 days.

(21) Appl. No.: 10/414,004

(22) Filed: Apr. 16, 2003

(65) Prior Publication Data

US 2003/0200406 A1    Oct. 23, 2003

(30) Foreign Application Priority Data

Apr. 17, 2002    (JP) .............................. 2002-114583

(51) Int. Cl.
  *G06F 12/14*    (2006.01)
(52) U.S. Cl. ..................................... 711/164
(58) Field of Classification Search ................ 711/103, 711/163, 164; 713/202
  See application file for complete search history.

(56) References Cited

U.S. PATENT DOCUMENTS 4,590,552 A * 5/1986 Guttag et al. ............... 711/163
5,097,445 A    3/1992 Yamauchi
5,216,633 A    6/1993 Weon et al.
5,469,564 A * 11/1995 Junya ......................... 713/202
6,226,199 B1 * 5/2001 Ichikawa ................ 365/185.04

FOREIGN PATENT DOCUMENTS

| CN | 1115058 A | 1/1996 |
| EP | 0 660 215 A2 | 6/1995 |
| JP | P2001-306400 A | 11/2001 |
| WO | WO 01/71497 A1 | 9/2001 |

* cited by examiner

*Primary Examiner*—Hiep T. Nguyen
(74) *Attorney, Agent, or Firm*—McDermott Will & Emery LLP

(57) ABSTRACT

An inventive nonvolatile semiconductor memory device is provided, in advance, with a column latch circuit 29 for performing a batch write operation (page latching operation, page programming operation, and verifying operation), and the column latch circuit 29 is utilized to realize a security function. The inventive memory device is further provided with a security control circuit 41 for carrying out control so that a password for deactivating the security function is stored in the column latch circuit 29 and a verifying operation is performed to determine whether the password stored in the column latch circuit 29 is identical to a security function deactivation code stored in a deactivation code storage 13. If it is determined that the password and the security function deactivation code are identical as a result of the verifying operation, the security function is deactivated.

24 Claims, 18 Drawing Sheets

NONVOLATILE SEMICONDUCTOR MEMORY DEVICE AND METHOD FOR PROVIDING SECURITY FOR THE SAME

BACKGROUND OF THE INVENTION

The present invention generally relates to nonvolatile semiconductor memory devices including security protection mechanisms and capable of electrically rewriting data, and methods for providing security for the devices.

In recent years, nonvolatile semiconductor memory devices typified by flash memories have been used in various fields since they are not only capable of electrically rewriting data but also capable of retaining data even if the devices are turned off. For example, nonvolatile semiconductor memory devices are used as memory devices for storing data in systems such as cellular phones, digital cameras and silicon audio players. Nonvolatile semiconductor memory devices are also used as internal memory devices of microcomputers provided in, for example, IC cards.

Nonvolatile semiconductor memory devices store therein, for example, programs for allowing systems to operate in accordance with desired procedures, information concerning individual privacy, and information protected by copyright. If these programs or pieces of information can be illegally read out or freely rewritten by a third party, critical problems occur in terms of security for classified information. Therefore, nonvolatile semiconductor memory devices are generally equipped with security circuits for providing security.

FIG. 20 is a circuit diagram for showing the configuration of a conventional nonvolatile semiconductor memory device. As shown in FIG. 20, the conventional nonvolatile semiconductor memory device includes: a data input/output buffer 1000 for exchanging address and data with external equipment; a security circuit 1003 for carrying out a security function; and a memory cell array 1011 in which a large number of memory cells are arranged.

The data input/output buffer 1000 receives address and data from outside and transfers the address and data to internal address bus 1001 and internal data bus 1002, respectively. A data terminal DATA is a bi-directional bus. For example, during a read operation, data in the internal data bus 1002 is outputted to external equipment via the data terminal DATA; on the other hand, during a write operation, data from the external equipment is inputted to the internal data bus 1002 via the data terminal DATA.

The security circuit 1003 includes: a password storage circuit 1004; a comparator 1005 for comparing an output value 1006 from the password storage circuit 1004 with a value from the internal data bus 1002; and an operation restriction circuit 1008 for restricting access to the memory cell array 1011.

Between the memory cell array 1011 and the operation restriction circuit 1008, data is exchanged through address bus 1009 and data bus 1010.

FIG. 21 is a flow chart illustrating a method for providing security for the conventional nonvolatile semiconductor memory device.

First, in step S2000, the memory device is put into a security authentication mode, and inputs a password for deactivating the security function through the data terminal DATA. In this case, the password is outputted from the data input/output buffer 1000 to the internal data bus 1002 and is then inputted to the comparator 1005.

Next, in step S2001, the comparator 1005 makes a comparison between the value 1006 representing the password outputted from the password storage circuit 1004 and the value representing the password inputted to the internal data bus 1002, thereby determining whether or not these values are identical to each other.

If the answer in step S2001 is YES, i.e., if it is determined that the passwords are identical, a high-level signal 1007 is outputted (see FIG. 20). On the other hand, if the answer in step S2001 is NO, i.e., if it is determined that the passwords are not identical, a low-level signal 1007 is outputted. The high-level and low-level signals 1007 are inputted to the operation restriction circuit 1008.

When the high-level signal 1007 is outputted, the process goes to step S2002 in which the operation restriction circuit 1008 receives the high-level signal 1007 signifying that the passwords are identical, and permits the deactivation of the security function. Once the security function has been deactivated, the process goes to step S2003 in which the internal address bus 1001 and address bus 1009 are connected to each other and the internal data bus 1002 and data bus 1010 are connected to each other. As a result, access to the memory cell array 1011 is enabled.

To the contrary, if it is determined in step S2001 that the password inputted through the data terminal DATA and the password stored in the password storage circuit 1004 are not identical, the signal 1007 outputted from the comparator 1008 is a low-level signal, and therefore, the operation restriction circuit 1008 does not permit the deactivation of the security function. Accordingly, the internal address bus 1001 and address bus 1009 are disconnected from each other, and the internal data bus 1002 and data bus 1010 are also disconnected from each other, thus preventing access to the memory cell array 1011.

As described above, in the conventional nonvolatile semiconductor memory device provided with the security circuit 1003, only a person who knows in advance the password stored in the password storage circuit 1004 has access to the memory cell array 1011; thus, illegal access by a third party can be prevented.

However, the conventional nonvolatile semiconductor memory device including the above-mentioned security circuit and conventional method for providing security (method for deactivating a security function) for the device present the following problems.

First, as shown in FIG. 20, the conventional security circuit has to be additionally provided with: the password storage circuit; and the comparator for making a comparison between the password stored in the password storage circuit and the password inputted through the data terminal, thus increasing the circuit size of a memory chip. However, in accordance with the trend toward miniaturization of equipment, the nonvolatile semiconductor memory device also needs to be reduced in size since the increase in circuit size as mentioned above becomes a contributory factor to inhibiting the miniaturization of equipment. Further, as a conceivable measure to enhance the security function, the number of bits for password may be increased. However, if the number of bits is increased, the password storage circuit and the comparator further increase in size, thus making the above-described problem more conspicuous.

Secondly, in order to implement the security function in the nonvolatile semiconductor memory device, it is necessary to put the memory device into not only a conventional operational mode but also another operational mode, i.e., a security authentication mode in which the password stored in the password storage circuit is compared with the password inputted through the data terminal. To adopt another operational mode in this manner adversely increases the complexity and size of a control circuit.

SUMMARY OF THE INVENTION

It is therefore an object of the present invention to provide a nonvolatile semiconductor memory device and a method for providing security for the device which realize a security function with a few additional circuits and without adopting an additional operational mode.

The inventive nonvolatile semiconductor memory device is based on a nonvolatile semiconductor memory device including: deactivation code storing memory cells for providing security; and a column latch circuit used to perform a program verifying operation. The inventive memory device further includes a control section for allowing, when a password for deactivating a security function has been inputted, the column latch circuit to latch the password, and for performing a verifying operation for determining whether the latched password is identical to a security function deactivation code stored in the deactivation code storing memory cells.

In this embodiment, the column latch circuit provided in advance in the nonvolatile semiconductor memory device and its function of performing a program verifying operation can be utilized to perform the operation of security authentication. Therefore, a security function is realized with a few additional circuits and without adopting an additional operational mode. As a result, it is possible to avoid an increase in the complexity of operation control and an increase in circuit size due to the addition of the security function.

The inventive memory device may start the latching operation and verifying operation when a security function deactivation command has been inputted or when at least a specified address or specified data has been inputted, and may further include a register for arbitrarily setting the security function deactivation command, specified address and specified data. In such an embodiment, the security function deactivation command, specified address and specified data can be arbitrarily set for each user or for each chip. Therefore, if a method for deactivating the security function is not open to the public, it is difficult for a malicious third party to identify the security function deactivation method. As a result, the function of providing security can be further enhanced.

When it is detected that the password is prohibited data, access to a memory cell array from outside is preferably prevented. In such an embodiment, it is possible to eliminate malicious access gained by using a password that is not identical to the security function deactivation code and deactivating the security function.

In another embodiment, the prohibited data includes a password in which no bit having programmed-state data exists, and a password, if all bits of the password are organized into a group or divided into two or more groups, having a group of bits in which no programmed-state data exists.

In still another embodiment, the security function is not deactivated if the specified address is not inputted before the operation of latching a password in the column latch circuit, or if at least the specified address or the specified data is not inputted before the verifying operation for determining whether the password is identical to the security function deactivation code stored in the deactivation code storing memory cells, and a register for arbitrarily setting the specified address and specified data is further provided. In such an embodiment, the specified address and the specified data can be arbitrarily set for each user or for each chip. Therefore, if the security function deactivation method is not open to the public, it is difficult for a malicious third party to identify the security function deactivation method. As a result, the function of providing security can be further enhanced.

The inventive memory device may further include: a data scrambling circuit for scrambling the password and for outputting the scrambled password to the column latch circuit; and a means for resetting data latched in the column latch circuit when it is determined that the password is not identical to the security function deactivation code during the verifying operation. In such an embodiment, the function of providing security can be further enhanced.

DESCRIPTION OF THE PREFERRED EMBODIMENTS

Hereinafter, preferred embodiments of the present invention will be described by taking, as an example, a flash memory that is a typical nonvolatile semiconductor memory device.

(First Embodiment)

Circuit Configuration

Figure 1:
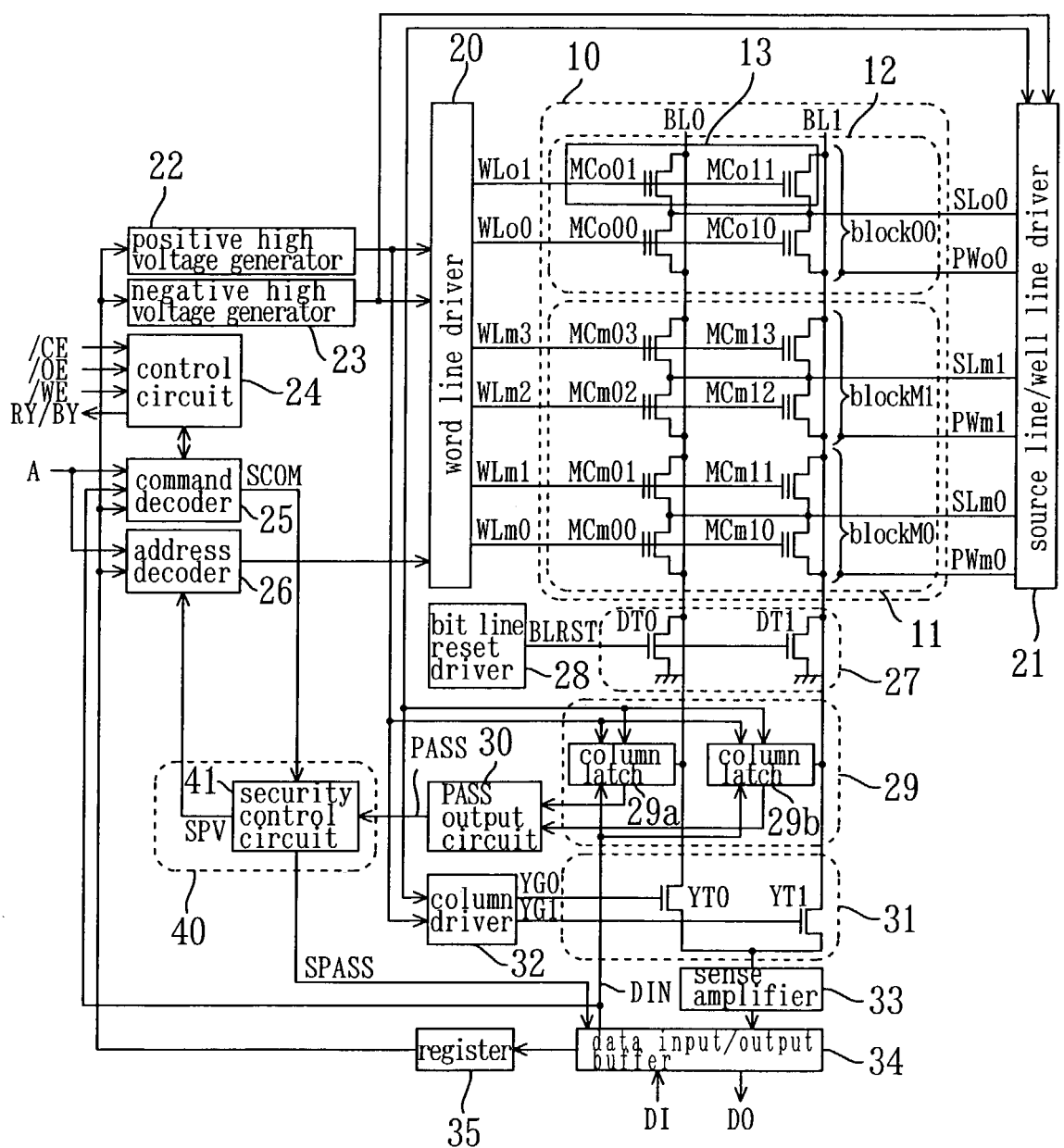
FIG. 1 is a circuit diagram showing the configuration of a nonvolatile semiconductor memory device according to a first embodiment.

FIG. 1 is a circuit diagram showing the configuration of a nonvolatile semiconductor memory device (flash memory) according to a first embodiment. As shown in FIG. 1, the nonvolatile semiconductor memory device of the present embodiment includes: a memory cell array 10; and a peripheral circuit that operates when data is stored in the memory cell array 10 and when data is read out from the memory cell array 10.

The memory cell array 10 includes a plurality of memory cells MCm00 to MCm13 and memory cells MCo00 to MCo11 that are arranged in rows and columns. The memory cell array 10 is divided into a main region 11 that is open to a user and an optional region 12 that is not open to a user. In the main region 11, a plurality of memory cells MCm00 to MCm13 (normal memory cells) are arranged. On the other hand, in the optional region 12, a plurality of memory cells MCo00 to MCo11 are arranged, and a security function deactivation code storage 13 (which will be herein called a "deactivation code storage") is formed by the memory cells MCo01 and MCo11 (which will be herein called "deactivation code storing memory cells"). The user can freely read, write and erase data from/on the main region 11. On the other hand, the user cannot freely read, write and erase data from/on the optional region 12. As will be described later, the optional region 12 stores various pieces of information such as redundant address information stored in the memory cell array, information for trimming the voltages of high-voltage generators, and memory cell address information including: a code for deactivating the security function (which will be herein called a "security function deactivation code"); a command for deactivating the security function (which will be herein called a "security function deactivation command") detected by a command decoder 25; and a security function deactivation command decoded by an address decoder 26.

The memory cell array 10 is provided with: word lines WLm0 to WLm3, and WLo0 and WLo1 that extend in rows from a word line driver 20 provided in the peripheral circuit, and that are connected to the gates of the associated memory cells; bit lines BL0 and BL1 that extend in columns from a column gate (column decoder) 31 provided in the peripheral circuit, and that are connected to the drains of the associated memory cells; source lines SLm0, SLm1 and Slo0 that extend in rows from a source line/well line driver 21 provided in the peripheral circuit, and that are connected to the sources of the associated memory cells; and well lines PWm0, PWm1 and PWo0 that extend in rows from the source line/well line driver 21, and that are connected to body region of the associated memory cells. Although the memory cell array in an actual nonvolatile semiconductor memory device includes a considerable number of word lines, bit lines, memory cells and so on other than those shown in FIG. 1, only part of them are shown for the sake of simplicity. The same goes for various circuits in each embodiment that is described below.

In the first embodiment, in the main region 11, the sources of the memory cells MCm00 to MCm11 are connected to the common source line SLm0 while their body region is connected to the common well line PWm0, and thus a block M0 is formed by the memory cells MCm00 to MCm11. The sources of the memory cells MCm02 to MCm13 are connected to the common source line SLm1 while their body region is connected to the common well line PWm1, and thus a block M1 is formed by the memory cells MCm02 to MCm13.

On the other hand, in the optional region 12, the sources of the memory cells MCo00 to MCo11 are connected to the common source line Slo0 while their body region is connected to the common well line PWo0, and thus a block O0 is formed by the memory cells MCo00 to MCo11.

The word line driver 20 receives a decode signal from the address decoder 26 and output voltages from positive high voltage generator 22 and negative high voltage generator 23, and applies a voltage required for the operation of the memory cell transistors to each word line connected thereto.

The source line/well line driver 21 applies a voltage required for the operation of the memory cell transistors to each source line and well line connected thereto.

The positive high voltage generator 22 generates a positive high voltage required for read, write and erase operations, for example. On the other hand, the negative high voltage generator 23 generates a negative high voltage required for read, write and erase operations, for example.

The memory device of the first embodiment further includes a control circuit 24. The control circuit 24 receives a chip enable signal /CE, an output enable signal /OE, a write enable signal /WE and a signal from the command decoder 25, and controls various operations such as read, write and erase operations. Control signals including a ready/busy signal RY /BY outputted from the control circuit 24 are inputted, for example, to the word line driver 20, the source line/well line driver 21, the positive high voltage generator 22, the negative high voltage generator 23, the command decoder 25, the address decoder 26, a bit line reset driver 28, a column latch circuit 29, a circuit 30 for outputting a signal PASS (which will be herein called a "PASS output circuit"), a column driver 32, a sense amplifier 33, a data input/output buffer 34, a register 35, and a security circuit 40. It is to be noted that in FIG. 1, there exist a number of control signals that are not shown. The operation of the overall memory device is controlled by the control signals outputted from the control circuit 24.

The command decoder 25 decodes a command consisting of an address inputted through an address terminal A and data inputted through a data input terminal DI, and generates a signal for controlling the start of various operations. If a command for deactivating the security function (security function deactivation command) is inputted to the command decoder 25, it sends a high-level security function deactivation command detection signal SCOM to a security control circuit 41. Herein, the security function deactivation command is a command provided specifically in advance.

The address decoder 26 decodes an address inputted through the address terminal A, and generates a decode signal for the selection of predetermined word line, source line, well line and bit line.

The memory device of the present embodiment further includes a bit line reset circuit 27 for setting the voltage of each bit line to a ground voltage. The bit line reset circuit 27 includes a transistor DT0 for setting the voltage of the bit line BL0 to a ground voltage, and a transistor DT1 for setting the voltage of the bit line BL1 to a ground voltage. The gates of the transistors DT0 and DT1 of the bit line reset circuit 27 are connected to the bit line driver 28, and the ON/OFF states of the transistors DT0 and DT1 are controlled in response to a driving signal BLRST outputted from the bit line driver 28.

The column latch circuit 29 includes column latches 29a, 29b . . . , each provided for the associated bit line. In the column latch circuit 29 shown in FIG. 1, the column latch 29a is connected to the bit line BL0 while the column latch 29b is connected to the bit line BL1. Although only two column latches 29a and 29b, and only two bit lines BL0 and BL1 are shown in FIG. 1 for the sake of simplicity, an actual device is provided with a considerable number of bit lines; therefore, a large number of column latch circuits are provided so that each column latch circuit is associated with a predetermined number of bit lines.

In the nonvolatile semiconductor memory device, the column latch circuit 29 is generally utilized when a latching operation is performed on data to be written, when a programming operation is performed based on the latched data, and when a verifying operation is performed to determine whether or not the memory cells are properly programmed after the programming operation. One of the features of the present embodiment is to utilize the program verifying operation of the column latch circuit 29 in order to carry out operations for security protection. These operations will be described later in detail.

The PASS output circuit 30 receives an output signal from the column latch circuit 29 during the verifying operation and outputs, when it is determined that all the necessary memory cells are properly programmed, a high-level signal PASS indicating the result of the verification.

The column gate 31 serves to connect the bit line BL0 or the bit line BL1 to the sense amplifier 33. The control gates of the transistors YT0 and YT1 are each connected to the column driver 32. The transistor YT0 receives a signal YG0 from the column driver 32, and connects the bit line BL0 to the sense amplifier 33 or disconnects the bit line BL0 from the sense amplifier 33. On the other hand, the transistor YT1 receives a signal YG1 from the column driver 32, and connects the bit line BL1 to the sense amplifier 33 or disconnects the bit line BL1 from the sense amplifier 33.

The sense amplifier 33 determines data stored in the memory cell(s) during a read operation, and outputs a high-level or low-level signal in accordance with the result of the determination.

When a command consisting of address and data, or data to be written is inputted, the data input/output buffer 34 outputs the command or data to be written, which is inputted through the data input terminal DI, to an internal data bus DIN. During a read operation, read out data outputted from the sense amplifier 33 is outputted to a data output terminal DO via the data input/output buffer 34. In this embodiment, provided as the external data terminals connected to the data input/output buffer 34 are the data input terminal DI as a unidirectional bus that allows only input, and the data output terminal DO as a unidirectional bus that allows only output. Alternatively, a single external data terminal may be provided and connected to the buffer 34 via a bi-directional bus that allows input and output.

The register 35 stores various pieces of information stored in the aforementioned optional region 12 such as redundant address information, information for trimming the voltages of the high voltage generators 22 and 23 (which will be herein called "voltage trimming information"), security function deactivation command information, and memory cell address information including a security function deactivation code. Signals concerning these pieces of information are inputted to, for example, the positive high voltage generator 22, the negative high voltage generator 23, the command decoder 25, and the address decoder 26. The register 35 is connected to the data input/output buffer 34, and the aforementioned various pieces of information stored in the optional region 12 when power is turned on are read out by the sense amplifier 33. The read out data is transmitted, via the data input/output buffer 34, to the register 35 and stored therein. In the following description, the aforementioned various pieces of information that are read out from the optional region 12 and stored in the register 35 are collectively called "optional data".

The security circuit 40 of the present embodiment includes the security control circuit 41. The security control circuit 41 receives the signal SCOM (security function deactivation command detection signal) sent from the command decoder 25, and the signal PASS (indicating the result of verification) sent from the PASS output circuit 30. And the security control circuit 41 outputs a security authentication verifying signal SPV for controlling the address decoder 26 and a security function deactivation signal SPASS for deactivating the security function.

The security function deactivation signal SPASS is inputted to the data input/output buffer 34. If the security function deactivation signal SPASS is at a low level, the security function is ON (i.e., the security function is activated), and therefore, access to the memory cell array 10 from outside is disabled. Specifically, when the security function deactivation signal SPASS is at a low level, read out data outputted from the sense amplifier 33 is not transmitted to the data output terminal DO during a read operation. In this case, a high-level signal is invariably outputted to the data output terminal DO for all bits, irrespective of the read data.

On the other hand, if the security function deactivation signal SPASS is at a high level, the security function is deactivated, and therefore, access to the memory cell array 10 from outside is enabled. Specifically, when the security function deactivation signal SPASS is at a high level, read out data outputted from the sense amplifier 33 is transmitted to the data output terminal DO during a read operation.

In the present embodiment, the description is made on the assumption that storage capacity is 1 megabit, and data bus width is 16 bits. Accordingly, sixteen terminals DI [0] to DI [15] are provided as the data input terminal DI, and sixteen terminals DO [0] to DO [15] are provided as the data output terminal DO. Furthermore, since the number of words is 65536, sixteen terminals A [0] to A [15] are provided as the address terminal A.

-Brief Description of Circuit Operation-

Hereinafter, a write operation in the nonvolatile semiconductor memory device according to the first embodiment will be described. First, the structure of a memory cell used in the nonvolatile semiconductor memory device of the present embodiment will be described since it is necessary for the understanding of the write operation.

Figure 2:
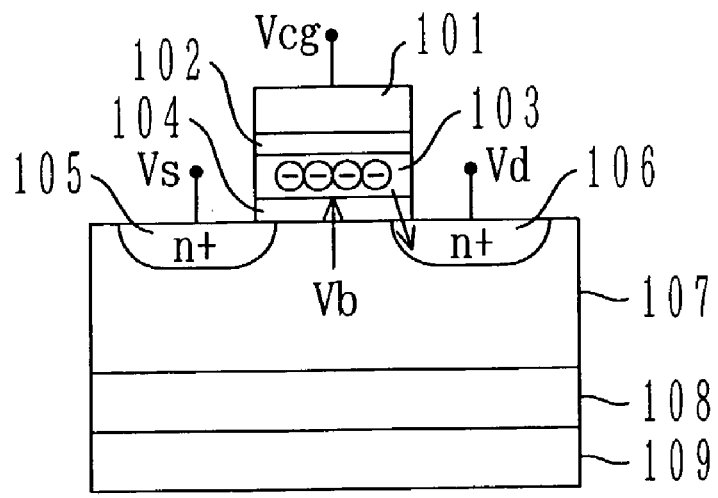
FIG. 2 is a cross-sectional view illustrating the structure of a memory cell transistor used in the nonvolatile semiconductor memory device of the first embodiment.

FIG. 2 is a cross-sectional view illustrating the structure of the memory cell transistor used in the nonvolatile semiconductor memory device of the present embodiment. As shown in FIG. 2, deep N-well 108 and P-well 107 are formed over the surface of a semiconductor substrate 109, and source region 105 and drain region 106 are formed in the P-well 107. A channel region is located between the source and drain regions 105 and 106 over the semiconductor substrate 109. Over the channel region, a tunnel oxide film 104, a floating gate 103 made of polysilicon, an ONO (Oxide-Nitride-Oxide) film 102, and a control gate 101 made of polysilicon are formed in this order. Furthermore, if a high voltage is applied between the control gate 101, and the source 105, drain 106 and P-well 107, there occurs a phenomenon that a tunnel current passing through the tunnel oxide film 104 is generated, thus allowing injection of electrons into the floating gate 103 and ejection of electrons from the floating gate 103. In the present embodiment, the operations of writing and erasing data are carried out by utilizing the fact that the threshold voltage of a memory cell (transistor) differs depending on the states of injection of electrons to the floating gate 103 and ejection of electrons from floating gate 103.

Figure 3:
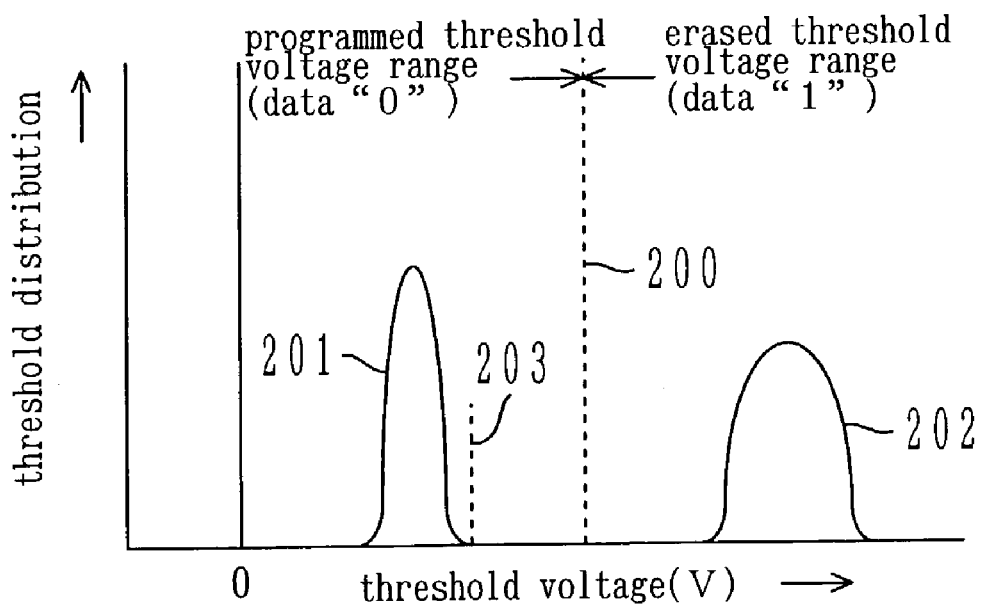
FIG. 3 is a graph showing the distribution of threshold value of a normal memory cell used in the nonvolatile semiconductor memory device of the first embodiment.

FIG. 3 is a graph showing the distribution of threshold value of a normal memory cell used in the nonvolatile semiconductor memory device of the present embodiment. If the threshold voltage is below a reference level 200 for read operation (i.e., if electrons are ejected from the floating gate 103), the memory cell is in a programmed state in which the memory cell retains data "0" (see a threshold value distribution 201). And if the threshold voltage is above the reference level 200 for read operation (i.e., if electrons are injected to the floating gate 103), the memory cell is in an erased state in which the memory cell retains data "1" (see a threshold value distribution 202). In the following description, data retained in a memory cell in the programmed state is data "0" and will be called "programmed-state data", while data retained in a memory cell in the erased state is data "1" and will be called "erased-state data". As used herein, the programmed-state data means data "0" while the erased-state data means data "1".

A write operation for putting a memory cell into the programmed state (i.e., a write operation for allowing a memory cell to retain data "0") is carried out in the following manner. The source 105 is put into an open state, while a voltage of −8 V, for example, is applied to the control gate 101, a voltage of 5 V, for example, is applied to the drain 106, and a ground voltage (0 V), for example, is applied to the well 107, thereby allowing electrons accumulated in the floating gate 103 to eject therefrom and flow to the drain 106. Since the threshold voltage of the transistor when electrons are ejected from the floating gate 103 is below the read operation reference level 200, a cell current flows through the memory cell, in which data "0" is written, during a read operation.

An erase operation for putting a memory cell into the erased state (i.e., an erase operation for allowing the memory cell to retain data "1") is carried out in the following manner. The drain 106 is put into an open state, while a voltage of 5 V, for example, is applied to the control gate 101, a voltage of −8 V, for example, is applied to the source 105 and the well 107, thereby injecting electrons to the floating gate 103 from the source 105 and the well 107. If the threshold voltage of the transistor when electrons are injected to the floating gate 103 is set at a value higher than the read operation reference level 200, the flow of a cell current is prevented during the read operation.

In the flash memory of the present embodiment, initially, each and every memory cell is in the erased state in which electrons are injected to the floating gate, and therefore, each and every memory cell retains data "1". It is to be noted that data "0" can be written in a memory cell retaining data "1", whereas data "1" cannot be written in a memory cell retaining data "0". In order to write data "1", potentials of the word lines, source lines and well lines have to be controlled. Therefore, data "1" can be written only when the erase operation is carried out at once for each block of memory cells.

A read operation for determining whether data in a memory cell is "0" or "1" is carried out in the following manner. A read voltage is applied to the control gate 101, a ground voltage (0 V) is applied to the source 105 and the well 107, and a voltage of about 1 V is applied to the drain 106. Whether a cell current flows or not in this state is determined by using a sense amplifier. If a cell current flows, it is determined that the memory cell is in the programmed state (i.e., the memory cell retains data "0"), and if a cell current does not flow, it is determined that the memory cell is in the erased state (i.e., the memory cell retains data "1")". The result of the determination is outputted as read out data.

Next, a write operation in the nonvolatile semiconductor memory device (flash memory) of the present embodiment will be described.

The speed of the write operation of a flash memory is on the order of microseconds, which is very slow. In the present embodiment, since the data input terminal DI has a 16-bit bus width, data is written by 16 bits at most if a normal writing method is used. Since the flash memory of the present embodiment is provided with the column latch circuit 29, a plurality of data to be written (data "0" or "1") is latched in the column latch circuit 29 in advance, and the latched data is written at once in memory cells connected to a single word line and an associated bit line, thus effectively reducing the length of time required for the write operation. The operation of latching data to be written in the column latch circuit 29 beforehand in this manner is herein called a "page latching operation", and the operation of writing data at once for each block of memory cells based on the data latched in the column latch circuit 29 is herein called a "page programming operation".

In the nonvolatile semiconductor memory device of the present embodiment, the column latch circuit 29 has the capability to latch 128-bit data, i.e., the column latch circuit 29 includes 128 column latches. Since the data input terminal DI has 16-bit bus width, 16 bits of data to be written can be latched in 16 column latches of the column latch circuit 29 by performing one cycle of the page latching operation. If the page latching operation is performed for eight cycles, 128 bits of data to be written can be latched in all the column latches 29a, 29b, . . . of the column latch circuit 29. In this case, the data to be written includes both of data "0" and data "1". Therefore, the page latching operation is performed so that 128 bits of data to be written is latched in the column latches 29a, 29b, . . . of the column latch circuit 29, and then the page programming operation is performed so that 128 bits of data is written at once.

When a batch write operation is performed, all the memory cells in which data is to be written (memory cells connected to a common word line) are initially allowed to retain data "1" (erased state). If data "0" is to be written in a memory cell, the memory cell in the erased state is put into the programmed state. On the other hand, if data "1" is to be written in a memory cell, the memory cell is allowed to remain in the erased state.

Figure 4:
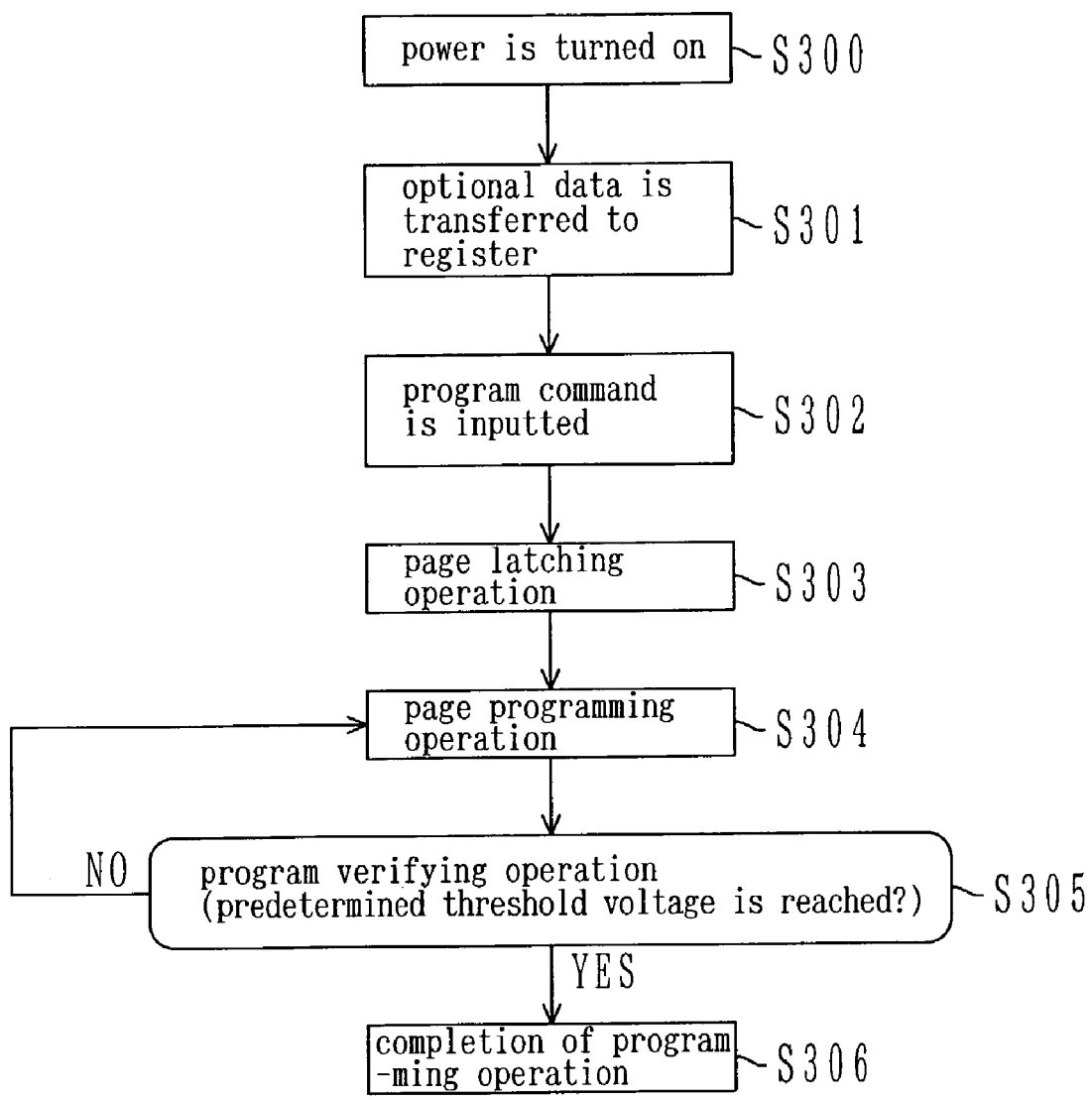
FIG. 4 is a flow chart illustrating a write operation in the nonvolatile semiconductor memory device according to the first embodiment.

Described below is the sequence of the write operation of the flash memory performed by utilizing the page latching operation and the page programming operation. The page latching and page programming operations are essentially the same as those carried out in already-existing nonvolatile semiconductor memory devices and are widely known techniques. FIG. 4 is a flow chart illustrating the write operation in the nonvolatile semiconductor memory device according to the present embodiment.

First, in step S300, power is supplied to the flash memory. Then, in step S301, optional data such as redundant address information and voltage trimming information stored in the optional region 12 in the memory cell array 10 are read out by the sense amplifier 33, and the read out optional data is transferred, via the data input/output buffer 34, to the register 35 and stored therein.

Next, in step S302, program commands are inputted through the address terminal A and the data input terminal DI, thus starting a programming operation.

Once the programming operation has started, the page latching operation is performed in step S303 so that 128 bits of data to be written is stored in the column latch circuit 29. As mentioned above, the page latching operation is performed for eight cycles.

When the page latching operation on 128 bits of data has been completed, the page programming operation is performed on the 128 bits of data stored in the column latch circuit 29 in step S304.

After the completion of the page latching operation, whether or not the threshold voltage of each memory cell that should be programmed is set at a predetermined threshold voltage (i.e., whether or not the threshold voltage of each memory cell that should be programmed reaches a predetermined threshold voltage) is determined in step S305. This operation will be herein called a "program verifying operation". In the present embodiment, the program verifying operation is carried out to determine whether or not electrons are sufficiently ejected from the floating gate of each memory cell transistor that should be programmed. To be more specific, the program verifying operation is carried out to determine whether or not the threshold voltage of each memory cell, in which data is written so as to put the memory cell into the programmed state, is below a program verifying reference level 203 (see FIG. 3). The program verifying operation is performed on 128 bits of data at once by using the column latch circuit 29. The program verifying operation performed by using the column latch circuit 29 will be described later in detail.

If it is determined in step S305 that the threshold value of any one of the memory cells that should be programmed does not reach the predetermined value, the process goes back to step S304 in which the page programming operation is performed again. On the other hand, if the threshold voltages of all the memory cells that should be programmed are each set at the predetermined value, the process goes to step S307 in which a high-level PASS signal is outputted from the PASS output circuit 30, thus completing the write operation.

Detailed Description of Write Operation

Hereinafter, the configuration of the column latch circuit 29 and the write operation performed using the column latch circuit 29 will be described in detail.

Figure 5A:
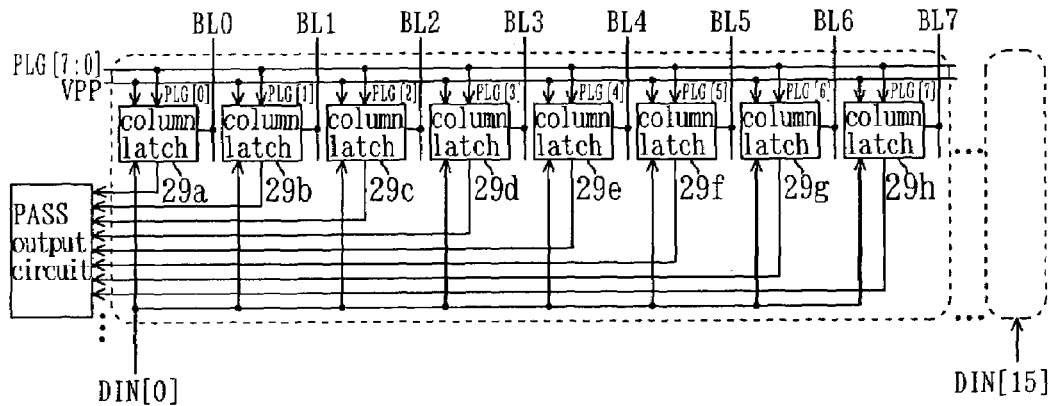
FIG. 5A is a circuit diagram showing the configuration of a column latch circuit, and 5B is a circuit diagram showing the configuration of a column latch.
Figure 5B:
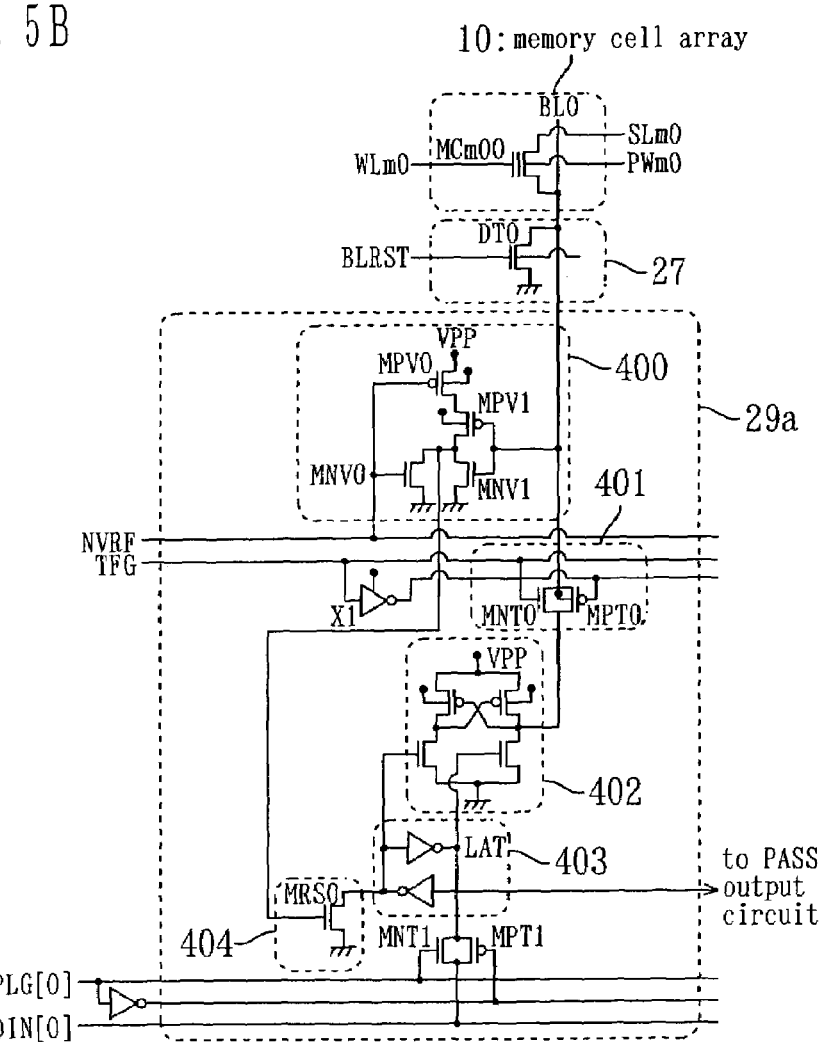

FIG. 5A is a circuit diagram showing the configuration of the column latch circuit 29, and FIG. 5B is a circuit diagram showing the configuration of a column latch. As shown in FIG. 5A, the column latch circuit 29 is connected to sixteen internal data buses DIN [0] to DIN [15] so as to deal with 16-bit input data. For example, the internal data bus DIN [0] is connected to eight column latches 29a to 29h. By carrying out one cycle of the page latching operation, data transferred via the internal data bus DIN [0] is stored in any one of the column latches 29a to 29h. The column latch for storing data is selected in response to signals PLG [0] to PLG [7]. For example, when the page latching operation is performed for eight cycles, the signal PLG [0] is at a high level in the first cycle of the page latching operation, and input data transferred via the internal data bus DIN [0] is stored in the column latch 29a. In the subsequent cycles of the page latching operation, the signals PLG [1] to PLG [7] are each placed at a high level in sequence, and thus input data transferred via the internal data bus DIN [0] is stored in the column latches 29a to 29h in sequence.

FIG. 5B is a circuit diagram showing the specific configuration of the column latch 29a in FIG. 5A. Although only the configuration of one column latch 29a is shown in FIG. 5B, the configuration of each of the column latches 29a to 29h, for example, is similar to that of the column latch 29a.

The column latch 29a includes: a bit line potential detection circuit 400 for detecting a bit line potential; a latch 403 for storing data to be written; a level shift circuit 402 for changing a logical signal from the latch 403 into a voltage Vpp; a transfer gate 401 for connecting a bit line BL0 to the level shift circuit 402 and the latch 403, and for disconnecting the bit line BL0 from the level shift circuit 402 and the latch 403; an inverter XI for activating a p-channel transistor of the transfer gate 401 when a control signal TFG is active; a latch reset circuit 404 for resetting, in response to an output from the bit line potential detection circuit 400, latched data in the latch 403; and transistors MNT1 and MPT1 for connecting the internal data bus DIN [0] to the latch 403 and for disconnecting the internal data bus DIN [0] from the latch 403.

It is to be noted that a power supply for supplying the voltage Vpp is connected to the level shift circuit 402, p-channel transistor MPT0 of the transfer gate 401, inverter XI, and p-channel transistors MPV0 and MPV1 of the bit line potential detection circuit 400.

The bit line potential detection circuit 400 includes one input section connected to the bit line BL0 and the other input section connected to a line through which a control signal NVRF is sent, and has the function of performing an NOR operation upon receiving two input signals. Furthermore, the bit line potential detection circuit 400 outputs a high-level signal when the control signal NVRF is at a low level and the potential of the bit line BL0 is lower than an inversed set value of the bit line potential detection circuit 400.

The output section of the bit line potential detection circuit 400 is connected to the latch reset circuit 404. If a high-level signal has been outputted from the bit line potential detection circuit 400, the latch reset circuit 404 is set to be active. By setting the latch reset circuit 404 to be active, the latch 403 is reset, and the potential of a node LAT of the latch 403 is set at a high level.

Hereinafter, the write operation performed by using the column latch circuit 29 configured as described above will be explained. The explanation will be made on the supposition that data is to be written in the memory cell connected to the word line WLm0.

Page Latching Operation

After program commands have been inputted, the page latching operation is performed so that data to be written is stored in the latch 403. In the first cycle of the page latching operation, the signal PLG [0] is placed at a high level, and the transistors MNT1 and MPT1 are turned ON, thus allowing the latch 403 in the column latch 29a to store input data transmitted through the internal data bus DIN [0]. If programmed-state data (data "0") is latched, the potential of the node LAT is kept at a low level; on the other hand, if erased-state data (data "1") is latched, the potential of the node LAT is kept at a high level.

Page Programming Operation

After the page latching operation has been performed for eight cycles, the page programming operation starts. First, the voltage Vpp is set at a program voltage (5 V). Then, the control signal TFG is activated, and the bit line BL0 is connected to the level shift circuit 402 and the latch 403. Simultaneously with this, the potential of the word line WLm0 connected to the selected memory cell is set at −8 V, the source line SLm0 is put into an open state, and the driving signal BLRST is deactivated to deactivate the bit line reset circuit 27.

In this case, if the potential of the node LAT of the latch 403 is at a low level (data "0"), a voltage of 5 V is applied to the bit line BL0 (i.e., the drain of the memory cell), and a voltage of 13 V is applied to the tunnel oxide film, thus allowing an FN tunnel current to flow therethrough. As a result, data is written in the memory cell. On the other hand, if the potential of the node LAT of the latch 403 is at a high level (data "1"), a ground voltage (0 V) is applied to the bit line BL0 (i.e., the drain of the memory cell), and a voltage of 8 V is applied to the tunnel oxide film, thus allowing no FN tunnel current to flow therethrough. As a result, data is not written in the memory cell.

After pulses for writing data is applied to each memory cell for a certain period of time, the transfer gate 401 is deactivated and the bit line BL0 is disconnected from the latch 403 and the level shift circuit 402. At the same time, the voltages of the word line WLm0 and the source line SLm0 are each set at a ground voltage, the driving signal BLRST is deactivated, and electrical charge accumulated in the bit line BL0 is discharged to set the voltage thereof at a ground voltage. Thus, the programming operation is completed.

Program Verifying Operation

Next, the program verifying operation is performed. First, the voltage Vpp is set at a supply voltage (VDD) which will be herein also called a "verifying drain voltage". Then, the driving signal BLRST is deactivated to deactivate the bit line reset circuit 27. At the same time, the transfer gate 401 is activated, and the bit line BL0 is connected to the latch 403 and the level shift circuit 402. In this case, if the potential of the node LAT of the latch 403 is at a low level (data "0"), i.e., if program-state data is latched in the bit line, the bit line is precharged with the supply voltage (VDD) (verifying drain voltage). On the other hand, if the potential of the node LAT of the latch 403 is at a high level (data "1"), i.e., if erased-state data is latched in the bit line, the voltage of the bit line is kept at a ground voltage.

Next, when the bit line, in which programmed-state data is latched, has been precharged, the transfer gate 401 is deactivated, and at the same time, a program verify voltage (1 V) is applied to the word line WLm0 connected to the selected memory cell, thereby starting the verifying operation. Now, attention is focused on the verifying operation performed on the memory cell in which programmed-state data is latched. A current flows through the memory cell if the threshold voltage of the memory cell reaches the level of the threshold voltage of a properly programmed memory cell. To be more specific, in the present embodiment, if electrons are sufficiently ejected from the floating gate of the memory cell transistor so that the threshold voltage thereof is below the program verifying reference level 203 (see FIG. 3), a current flows through the memory cell. In that case, electrical charge in the bit line precharged with the verifying drain voltage (VDD) is discharged, and the bit line potential decreases to become closer to a ground potential. On the other hand, no current flows through the memory cell if the threshold voltage of the memory cell does no reach the level of the threshold voltage of a properly programmed memory cell. In that case, the bit line potential is kept at a level corresponding to the verifying drain voltage (VDD). As for the verifying operation performed on the memory cell in which erased-state data is latched, the bit line potential is invariably kept at a level corresponding to a ground voltage from the beginning of the verifying operation.

Next, after a certain period of time has passed, the control signal NVRF for the bit line potential detection circuit 400 is set at a low level to activate the bit line potential detection circuit 400. Now, attention is focused on the verifying operation performed on the memory cell in which programmed-state data is latched. If the threshold voltage of the memory cell reaches the level of the threshold voltage of a properly programmed memory cell, the bit line potential becomes lower than the verifying drain voltage (VDD) and the inversed set value of the bit line potential detection circuit 400. Therefore, the bit line potential detection circuit 400 outputs a high-level signal, and the latch reset circuit 404 becomes active. As a result, the potential of the node LAT of the latch 403 is changed from a low level (data "0") to a high level (data "1"). On the other hand, if the threshold voltage of the memory cell does not reach the level of the threshold voltage of a properly programmed memory cell, the bit line potential is kept at a level corresponding to the verifying drain voltage (VDD). Therefore, the bit line potential detection circuit 400 outputs a low-level signal, and the latch reset circuit 404 remains deactivated. As a result, the potential of the node LAT of the latch 403 is kept at the level during the page programming operation.

If the threshold voltage of the memory cell reaches the level of the threshold voltage of a properly programmed memory cell after the above-described procedural steps have been carried out, data (voltage value) latched in the node LAT is changed to a high level (data "1") by the program verifying operation, and therefore, the programming operation will not be performed thereafter. Now, attention is focused on the verifying operation performed on the memory cell in which erased-state data is latched. Since the bit line potential is kept at a level corresponding to a ground voltage, the bit line potential detection circuit 400 outputs a high-level signal, and the latch reset circuit 404 is set to be active. As a result, the potential of the node LAT of the latch 403 is set at a high level (data "1"), which is the same as that of the node LAT at the start of the verifying operation.

Summarized below is how data (latch data) latched in the node LAT changes after the program verifying operation in the column latch circuit configured as described above.

TABLE 1

| Latch data at the start of verifying operation | Memory cell data | Latch data after the verifying operation |
|---|---|---|
| 0 | 0 | 1 |
| 0 | 1 | 0 |
| 1 | 0 | 1 |
| 1 | 1 | 1 |

As shown in the first row of Table 1, if latch data at the start of the verifying operation is at a low level (data "0") and data stored in memory cell(s) (which will be herein called "memory cell data") is programmed-state data (data "0"), the latch data after the completion of the verifying operation is changed from a low level (data "0") to a high level (data "1").

As shown in the second row of Table 1, if latch data at the start of the verifying operation is at a low level (data "0") and memory cell data is erased-state data (data "1"), the latch data after the completion of the verifying operation is kept at a low level (data "0").

As shown in the third and fourth rows of Table 1, if latch data at the start of the verifying operation is at a high level (data "1"), the latch data after the completion of the verifying operation is kept at a high level (data "1") irrespective of the state of memory cell data.

It is to be noted that the third row of Table 1 shows the case where latch data at the start of the verifying operation is at a high level (data "1") and memory cell data is programmed-state data (data "0"). As a matter of fact, since memory cells on which the page programming operation is to be performed are all put into the erased state (data "1") before the page programming operation, such a case is unlikely to happen in an actual program verifying operation performed when data is rewritten. However, as will be described later, if this operation is utilized for the security function of the present invention, part of memory cells storing a security function deactivation code may naturally be in the programmed state (data "0"). Therefore, the case shown in the third row may occur. In that case, although the data to be written and memory cell data are not identical, the latch data after the completion of the verifying operation is "1".

When the latch data (the data latched in the node LAT) is all placed at a high level (data "1") by the program verifying operation, i.e., when data to be written and memory cell data are identical, the PASS output circuit 30 outputs a high-level PASS signal, thus completing the write operation. However, if a memory cell, whose threshold voltage does not reach the level of the threshold voltage of a properly programmed memory cell, exists even for one bit, then there exists low-level data (data "0") latched in the node LAT after the completion of the program verifying operation. In this case, the PASS output circuit 30 outputs a low-level PASS signal, and the programming operation and verifying operation are repeatedly performed until the PASS output circuit 30 outputs a high-level PASS signal.

Method for Providing Security

Described in detail below is a method for providing security (or method for deactivating a security function) for the nonvolatile semiconductor memory device according to the present invention, using the above-described widely known program verifying operation.

The inventive security method (security function deactivation method) is characterized in that the method is employed by utilizing the column latch circuit provided in advance in the nonvolatile semiconductor memory device, and by performing the page latching and program verifying operations.

Figure 6:
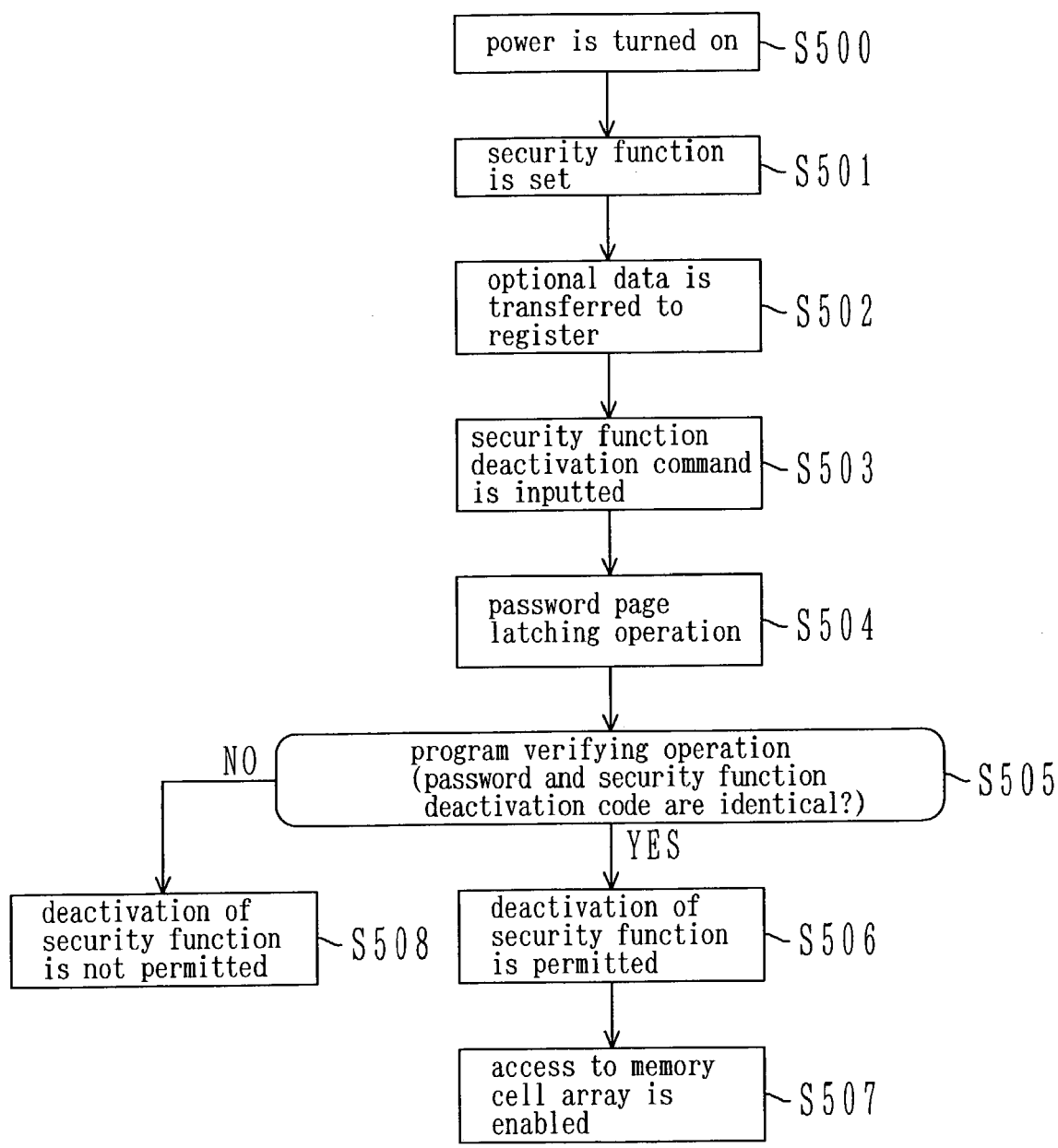
FIG. 6 is a flow chart illustrating the procedures of a method for deactivating a security function for the nonvolatile semiconductor memory device according to the first embodiment.

FIG. 6 is a flow chart illustrating the procedures of the security function deactivation method for the nonvolatile semiconductor memory device according to the first embodiment.

First, in step S500, power is supplied to the nonvolatile semiconductor memory device that is provided with a security function in advance. In step S501, the security function is activated, thus prohibiting access to the memory cell array 10 from outside.

Next, in step S502, the sense amplifier 33 reads out various pieces of information (optional data) stored in the optional region 12 such as redundant address information, voltage trimming information, security function deactivation command information, and memory cell address information including a security function deactivation code. And the read out data is transmitted, via the data input/output buffer 34, to the register 35 and is stored therein.

Thereafter, in step S503, security function deactivation commands for deactivating the security function are inputted through the address terminal A and the data input terminal DI.

Then, in step S504, if it is detected that a proper security function deactivation command is inputted, a password for deactivating the security function is inputted. The input password is stored in the column latch circuit 29 due to the page latching operation. By carrying out the page latching operation for eight cycles, 128-bit password is stored in the column latch circuit 29 via the input data terminals DI [0] to DI [15].

When the operation of storing the password in the column latch circuit 29 has been completed, the verifying operation is performed in step S505 to determine whether or not the password stored in the column latch circuit 29 is identical to the security function deactivation code stored in the deactivation code storage 13. In the following description, the verifying operation for determining whether or not the password, stored in the column latch circuit 29, is identical to the security function deactivation code, stored in the memory cells of the deactivation code storage 13, will be herein called a "security authentication verifying operation".

In step S505, if it is determined that the latch data in the node LAT is all at a high level (data "1") after the completion of the security authentication verifying operation, i.e., if it is determined that the input password is identical to the security function deactivation code, the PASS output circuit 30 outputs a high-level PASS signal, and the process goes to step S506 in which the security function is deactivated.

After the security function has been deactivated, access to the memory cell array 10 from outside is enabled in step S507, thus allowing read, write and erase operations, for example.

To the contrary, in step S505, if latch data in the node LAT is not totally at a high level (data "1"), i.e., if it is determined that the input password is not identical to the security function deactivation code, the PASS output circuit 30 outputs a low-level PASS signal, and the process goes to step S508 in which the security function is not deactivated. In this case, access to the memory cell array 10 from outside is still prohibited.

As described above, in order to deactivate the security function, a security function deactivation command has to be inputted, and then it is necessary to input a password that is identical to the security function deactivation code stored in the memory cells.

Timing Chart

Figure 7:
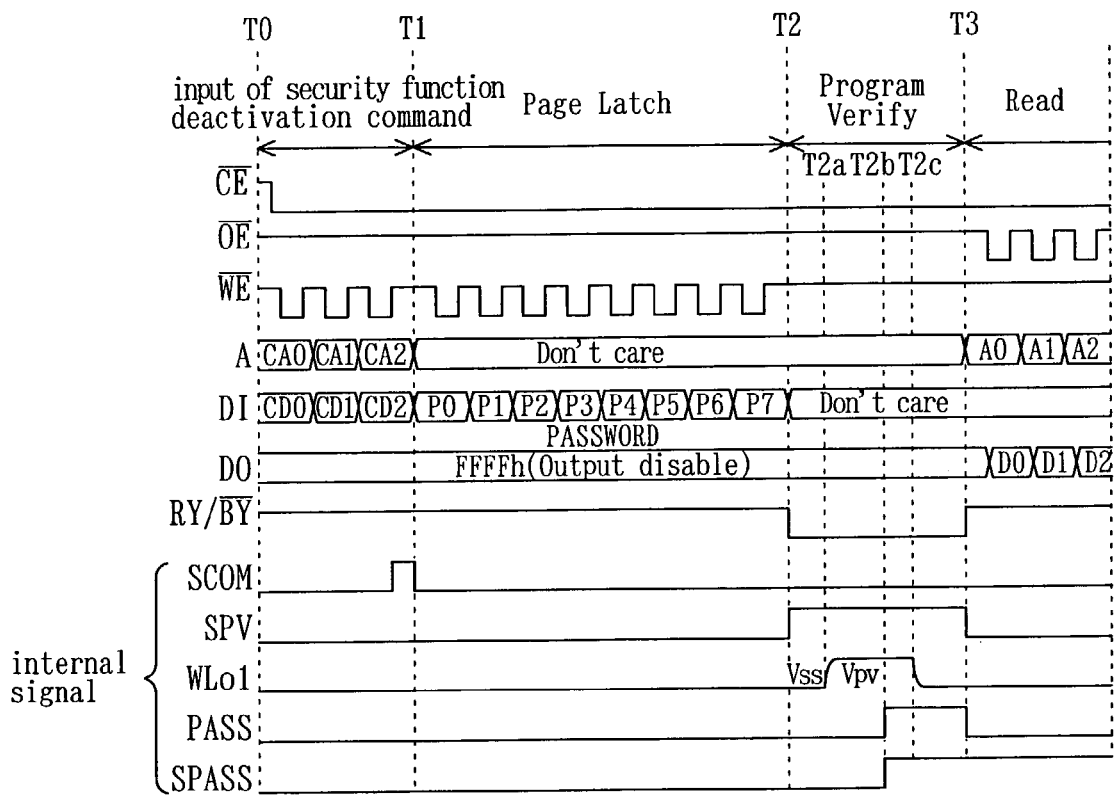
FIG. 7 is a timing chart illustrating the procedures of the security function deactivation method for the nonvolatile semiconductor memory device according to the first embodiment.

FIG. 7 is a timing chart illustrating the procedures of the security function deactivation method for the nonvolatile semiconductor memory device according to the first embodiment.

As shown in FIG. 7, at the time of T0, a security function deactivation command is inputted. Although the security function deactivation command is a command for three cycles (CA0 to CA2, and CD0 to CD2) in the present embodiment, the number of cycles of the security function deactivation command is not limited to three. The command decoder 25 detects the input of the security function deactivation command, and outputs a high-level signal SCOM to the security control circuit 41. In this case, FFFFh (Output disable) is outputted through the data output terminals DO [0] to DO [15], and therefore, a read operation is not allowed.

Next, from the time T1 at which the security control circuit 41 has received the high-level signal SCOM, the process goes to the step of inputting a password for deactivating the security function. The input password is stored in the column latch circuit 29 as a result of the page latching operation. By carrying out the page latching operation for eight cycles, 128-bit password (P0 to P7) is stored in the column latch circuit 29 via the input data terminals DI [0] to DI [15]. Note that the setting of the address terminal A during the page latching operation is an arbitrary setting "Don't Care".

After the page latching operation for storing the password in the column latch circuit 29 has been completed at the time of T2, the ready/busy signal RY/BY is placed at a low level and put into a busy state, and the verifying operation is performed to determine whether or not the password, stored in the column latch circuit 29, is identical to the security function deactivation code, stored in the memory cells of the deactivation code storage 13. During the verifying operation, the security control circuit 41 outputs the high-level security authentication verifying signal SPV to the address decoder 26. When the high-level signal SPV is inputted to the address decoder 26, the address decoder 26 generates a decode signal so as to select the address of the memory cells in the optional region 12 which store the security function deactivation code.

Then, at the time T2a, the word line WLo1 connected to the memory cells MCo01 and MCo11 of the deactivation code storage 13 is selected, and an output voltage Vpv from the positive high voltage generator 22 is applied to the word line WLo1, Thus, the verifying operation is performed to determine whether or not the password, stored in the column latch circuit 29, is identical to the security function deactivation code.

Next, if it is determined that the password and the security function deactivation code are identical as a result of the verifying operation at the time T2b, i.e., if the latch data in the node LAT is all at a high level after the verifying operation, the PASS output circuit 30 outputs a high-level PASS signal. The high-level PASS signal is inputted to the security control circuit 41, and the security control circuit 41, which has received the high-level PASS signal, outputs a high-level signal SPASS for deactivating the security function. The high-level signal SPASS is inputted to the data input/output buffer 34, thus deactivating the security function and enabling access to the memory cell array 10 from outside.

At the time of T2c, the verifying operation is completed, and the voltage of the selected word line WLo1 is set at a ground voltage.

After the time T3, the security function is deactivated; therefore, if a read operation is performed, memory cell data D0 to D2 is outputted to the data output terminals DO [0] to DO [51].

However, if it is determined that the password and the security function deactivation code are not identical as a result of the verifying operation, i.e., if latch data in the node LAT after the verifying operation is not totally at a high level, the PASS output circuit 30 outputs a low-level PASS signal to the security control circuit 41, and the security control circuit 41 outputs a low-level signal SPASS. As a result, the security function is not deactivated. In this case, even if a read operation is performed, memory cell data cannot be read out, and FFFFh (Output disable) is invariably outputted through the data output terminals DO [0] to DO [15].

Relationship Between Security Function Deactivation Code and Password

FIGS. 8A through 8H are diagrams illustrating how latch data changes before and after the verifying operation, in accordance with various security function deactivation codes and passwords.

As mentioned above, the verifying operation in the present embodiment is performed on 128-bit latch data that is stored in the column latch circuit by carrying out the page latching operation for eight cycles. However, for the sake of simplicity, how one word of latch data (16-bit data) changes will be described. Note that the value of the security function deactivation code stored in memory cells is "5555h".

Figure 8:
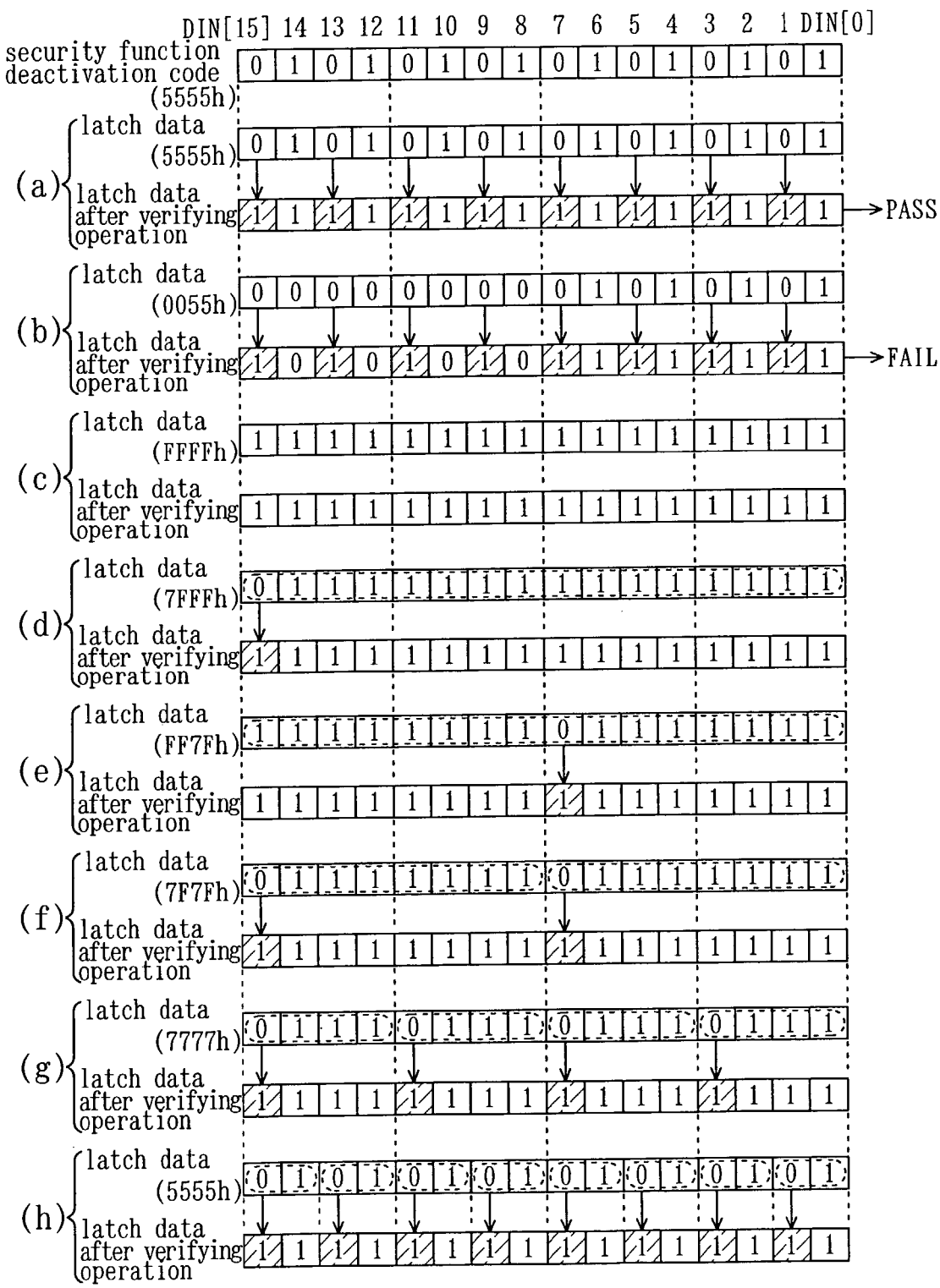
FIGS. 8A through 8H are diagrams for illustrating how latched data changes before and after the verifying operation, in accordance with various security function deactivation codes and passwords.

As shown in FIG. 8A, if "5555h" that is the same as the security function deactivation code is inputted as a password, the latch data after the verifying operation is all data "1". Therefore, a high-level PASS signal is outputted from the PASS output circuit 30, thus deactivating the security function.

If a password "0055h" is stored in the column latch circuit 29 as shown in FIG. 8B, the fifteenth, thirteenth, eleventh, ninth, seventh, fifth, third, and first latch data, corresponding to data "0" in the security function deactivation code, is changed from data "0" to data "1" after the verifying operation. On the other hand, the fourteenth, twelfth, tenth, and eighth latch data, corresponding to data "1" in the security function deactivation code, is still data "0" after the verifying operation. Accordingly, since not all the latch data is data "1", a low-level PASS signal is outputted from the PASS output circuit 30, and thus the security function is not deactivated.

As shown in FIG. 8C, if a password "FFFFh" is stored in the column latch circuit 29, all the latch data is still data "1" after the verifying operation. This is because if the latch data at the start of the verifying operation is data "1", the latch data remains as data "1" after the verifying operation irrespective of the state of memory cell data, as described above. Since all the latch data is data "1" after the verifying operation like this, the PASS output circuits 30 might output a high-level PASS signal to deactivate the security function, even though the password and the security function deactivation code are not identical.

If the input latch data is "7FFFh", "FF7Fh", "7F7Fh" and "7777h" as shown in FIGS. 8D, 8E, 8F and 8G, respectively, all bits of latch data after the verifying operation is data "1" as in the case shown in FIG. 8C. Therefore, even though the password and the security function deactivation code are not identical, the PASS output circuit 30 might output a high-level PASS signal to deactivate the security function. A detailed description will be made later as for FIGS. 8C through 8G and FIG. 8H.

As described above, basically, the security function is deactivated so long as the latch data after the verifying operation is all data "1", i.e., so long as the input password and security function deactivation code are identical. It is to be noted that if a special password is set, the security function might be deactivated even if the password and the security function deactivation code are not identical. However, by taking measures to eliminate passwords having certain data (e.g., data shown in FIGS. 8C through 8G), it becomes possible to eliminate the probability of unfavorable deactivation of the security function. The specific measures to be taken for this purpose will be described in another embodiment described later.

The security function deactivation command in the present embodiment is determined by the security function deactivation command information stored in the register 35. Therefore, the security function deactivation command can be modified whenever necessary by changing the value to be stored in the register 35, i.e., the security function deactivation command information to be stored, in advance, in the optional region 12. In such an embodiment, it is possible to arbitrarily set and/or alter the security function deactivation command for each user or for each chip. Therefore, if the security function deactivation command is not open to the public, it is difficult for a malicious third party to identify the security function deactivation command. Consequently, the function of providing security can be further enhanced.

Besides, the address of the memory cell to be verified during the security authentication verifying operation is determined by the memory cell address information including the security function deactivation code stored in the register 35. Therefore, the address of the memory cell to be verified can be modified whenever necessary by changing the value to be stored in the register 35, i.e., the memory cell address information including the security function deactivation code stored in advance in the optional region 12. In such an embodiment, it is possible to arbitrarily set and/or alter, for each user or for each chip, the address of the memory cell storing the security function deactivation code. Therefore, it is hard to identify the address of the memory cell storing the security function deactivation code. Consequently, it is difficult for a malicious third party to read the security function deactivation code, thus further enhancing the function of providing security.

Furthermore, the present embodiment has been described on the supposition that the number of bits for input password and security function deactivation code is 128 bits, which is the same as the number of bits (i.e., the number of column latches in the column latch circuit 29) for the memory cells of the flash memory on which the page programming operation is performed. Alternatively, the number of bits for the input password and the security function deactivation code may differ from the number of column latches in the column latch circuit 29 of the flash memory. For example, if the number of bits for the input password and the security function deactivation code is 64 bits, 64-bit password is stored in the column latch circuit 29 by carrying out the page latching operation for four cycles. In this manner, according to the present invention, the number of bits for the security function deactivation code can be changed, and thus the function of providing security can be freely set in response to the demands of equipment.

As described above, the present invention utilizes the column latch circuit 29 that is provided in advance in the nonvolatile semiconductor memory device and that is used for a batch write operation, thereby performing the security authentication verifying operation. Therefore, unlike the conventional nonvolatile semiconductor memory device having the function of providing security, a latch circuit for storing a password and a comparator are not required in the present embodiment, thus realizing the security function without increasing circuit size. Besides, the present invention utilizes the page latching operation for storing data to be written in the column latch circuit 29, and the verifying operation for determining whether or not latch data and memory cell data are identical, thereby performing the security authentication verifying operation. Therefore, an additional operational mode does not have to be adopted, thus realizing the security function without increasing the size of the control circuit. Moreover, since the number of bits (number of column latches) for a batch write operation is large in the nonvolatile semiconductor memory device, the number of bits for the security function deactivation code can be raised without increasing the circuit size. In other words, the function of providing security can be easily enhanced.

Since the security function deactivation command and the address of memory cells storing the security function deactivation code can be arbitrarily set and/or modified by changing the value set in the register, the function of providing security can be further enhanced.

In this embodiment, the deactivation of the security function (latching operation and verifying operation) may be carried out when it is detected that not the security function deactivation command but a specified address or specified data is inputted or both of the specified address and the specified data are inputted. This detection may be performed when power is turned on, may be performed when a reset mode is deactivated, or may be performed before the start of the page latching operation for storing data to be written in the column latch circuit.

Furthermore, if the values of the specified address and specified data, which are set for each user or for each chip, are stored as specified address and data information in the register 35, the values stored in the register 35, i.e., the specified address and data information stored in advance in the optional region 12 can be changed whenever necessary. In such an embodiment, since the specified address and data can be arbitrarily set and/or modified for each user or for each chip, it is difficult for a malicious third party to read the specified address and specified data (specified data), thus further enhancing the function of providing security.

(Second Embodiment)

In the verifying operation of the first embodiment, if all the latch data is data "1" at the start of the verifying operation, all the latch data after the verifying operation is data "1" irrespective of the data in the security function deactivation code stored in memory cells, and therefore, the PASS output circuit 30 is bound to output a high-level PASS signal as a result of the verifying operation. Accordingly, if a password in which all the data is "1" is stored in the column latch circuit 29, the security function can be deactivated irrespective of the data in the security function deactivation code. Therefore, a means for detecting that input latch data is prohibited data is provided in the second embodiment. As used herein, the prohibited data refers to, when all bits of input data are organized into a group or divided into two or more groups, input data having a group of bits in which all the data is "1". In other words, the prohibited data refers to input data or latch data used as an invalid password. If the means for detecting the prohibited data detects that the input data (latch data) is the prohibited data, the security function is not deactivated.

Circuit Configuration and Operation

Figure 9:
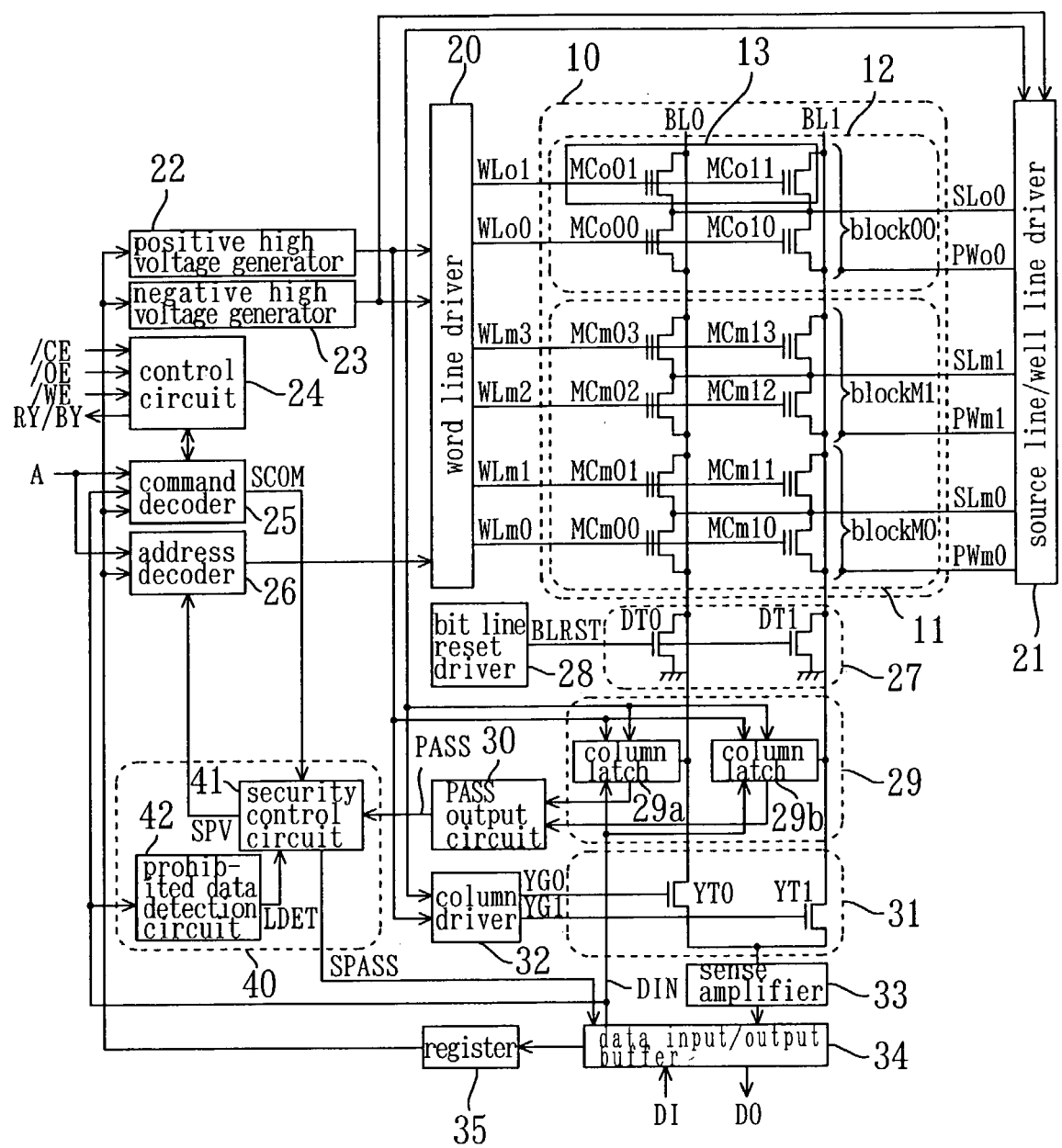
FIG. 9 is a circuit diagram showing the configuration of a nonvolatile semiconductor memory device according to a second embodiment.

FIG. 9 is a circuit diagram showing the configuration of a nonvolatile semiconductor memory device (flash memory) according to the second embodiment. In FIG. 9, the same components as the counterparts described in the first embodiment are identified by the same reference characters, and the description thereof will be omitted. Only the components that are not provided in the memory device shown in FIG. 1 will be described below.

In the memory device shown in FIG. 9, in addition to the circuits in the first embodiment shown in FIG. 1, a prohibited data detection circuit 42 (means for detecting prohibited data) is provided in the security circuit 40. The prohibited data detection circuit 42 is connected with the internal data bus DIN. Suppose the prohibited data detection circuit 42 receives input data (latch data) via the internal data bus DIN during the page latching operation, and detects the input data as the prohibited data. In that case, the prohibited data detection circuit 42 outputs a high-level prohibited data detection signal LDET to the security control circuit 41. It is to be noted that in the memory device shown in FIG. 9, although the input data itself is not the data latched in the column latch, the input data is also called "latch data" for the sake of convenience. As mentioned above, the prohibited data detection circuit 42 is provided in order to prevent, if the input password data (latch data) is the prohibited data, the security function from being deactivated irrespective of the security function deactivation code stored in memory cells. Therefore, if the prohibited data detection circuit 42 detects that the input data or latch data is the prohibited data during the page latching operation performed on the input password, the prohibited data detection circuit 42 outputs a high-level prohibited data detection signal LDET to the security control circuit 41, thereby preventing the deactivation of the security function.

It should be noted that although the prohibited data detection circuit 42 and the column latch circuit 29 are provided in parallel with respect to the data input/output buffer 34 in the memory device shown in FIG. 9, the prohibited data detection circuit 42 and the column latch circuit 29 may be provided in series. Even in that case, the effects of the present embodiment can be achieved. For example, the prohibited data detection circuit 42 may be provided between the data input/output buffer 34 and the column latch circuit 29, or may be provided between the column latch circuit 29 and the PASS output circuit 30.

FIGS. 10A through 10D are diagrams each showing a specific exemplary configuration of the prohibited data detection circuit 42. The prohibited data detection circuit 42 is configured by combining arithmetic circuits such as NAND circuit, NOR circuit and inverter circuit.

Figure 10A:
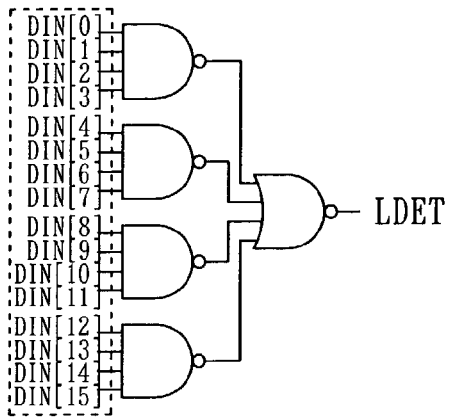
FIGS. 10A through 10D are diagrams each showing a specific exemplary configuration of a prohibited data detection circuit.
Figure 10B:
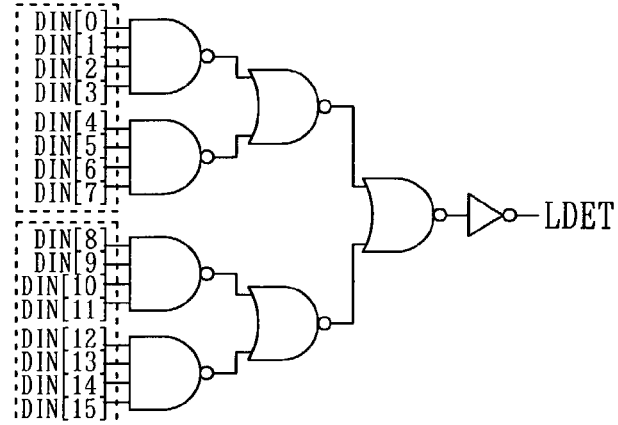
Figure 10C:
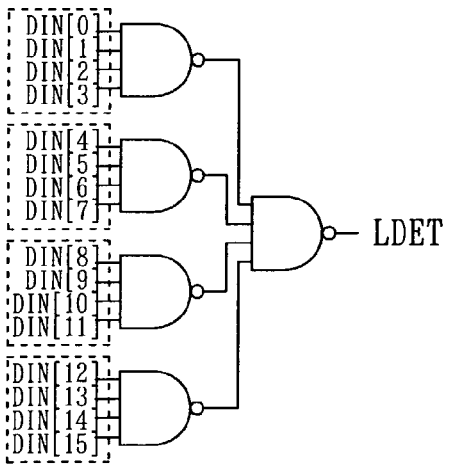
Figure 10D:
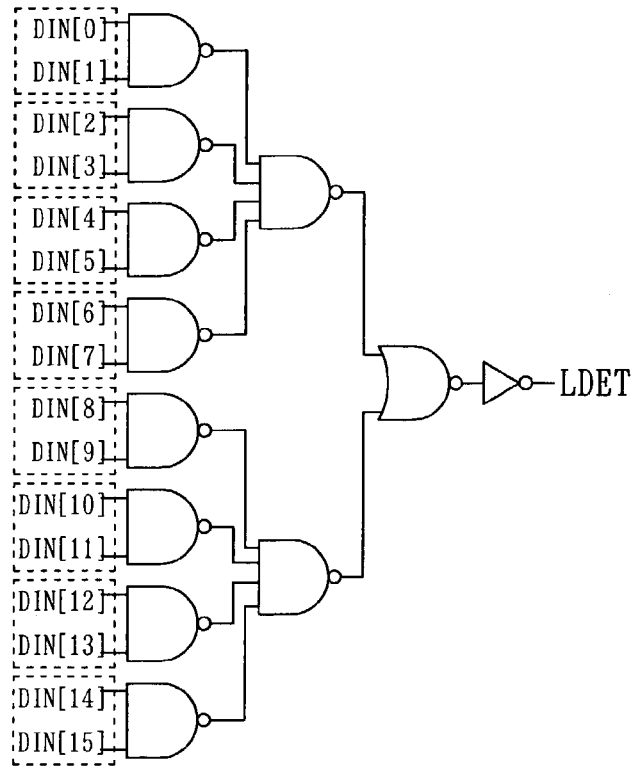

The internal data buses DIN [0] to DIN [15] are organized into a 16-bit group in the exemplary configuration of the prohibited data detection circuit 42 shown in FIG. 10A, divided into 8-bit groups in the exemplary configuration shown in FIG. 10B, divided into 4-bit groups in the exemplary configuration shown in FIG. 10C, and divided into 2-bit groups in the exemplary configuration shown in FIG. 10D. In each of the exemplary configurations, if it is detected that all bits of data is "1" in one of the groups, the deactivation of the security function is stopped.

In the exemplary configuration shown in FIG. 10A, if all the input data (latch data) transmitted via the internal data buses DIN [0] to DIN [15] is data "1", the prohibited data detection circuit 42 outputs a high-level prohibited data detection signal LDET.

In the exemplary configuration shown in FIG. 10B, if all the input data (latch data) transmitted via the internal data bus group DIN [0] to DIN [7] or the internal data bus group DIN [8] to DIN [15] is data "1", the prohibited data detection circuit 42 outputs a high-level prohibited data detection signal LDET.

In the exemplary configuration shown in FIG. 10C, if all the input data (latch data) transmitted via any one of the internal data bus groups (i.e., the internal data bus group DIN [0] to DIN [3], the internal data bus group DIN [4] to DIN [7], the internal data bus group DIN [8] to DIN [11], and the internal data bus group DIN [12] to DIN [15]) is data "1", the prohibited data detection circuit 42 outputs a high-level prohibited data detection signal LDET.

In the exemplary configuration shown in FIG. 10D, if the input data (latch data) transmitted via any one of the internal data bus groups (i.e., the internal data bus group DIN [0] and DIN [1], the internal data bus group DIN [2] and DIN [3], the internal data bus group DIN [4] and DIN [5], the internal data bus group DIN [6] and DIN [7], the internal data bus group DIN [8] and DIN [9], the internal data bus group DIN [10] and DIN [11], the internal data bus group DIN [12] and DIN [13], and the internal data bus group DIN [14] and DIN [15]) is all data "1", the prohibited data detection circuit 42 outputs a high-level prohibited data detection signal LDET.

In the memory device shown in FIG. 9, if this high-level prohibited data detection signal LDET outputted from the prohibited data detection circuit 42 is fed to the security control circuit 41, the security function is not deactivated.

Now, how latch data changes before and after the verifying operation will be described with reference to FIGS. 8C through 8H. As already described in the first embodiment, the value of the security function deactivation code stored in memory cells is "5555h".

As shown in FIG. 8C, if the password "FFFFh" is stored in the column latch circuit 29, all bits of latch data is "1" after the verifying operation. Therefore, in the first embodiment, the security function is deactivated even though the password and the security function deactivation code are not identical. To cope with this, in the second embodiment, the prohibited data detection circuit 42 configured as shown in FIG. 10A is provided so as to detect that the data (latch data) "FFFFh" is inputted as the password. Accordingly, the prohibited data detection circuit 42 outputs a high-level prohibited data detection signal LDET, thus preventing the deactivation of the security function.

As shown in FIGS. 8D and 8E, if the password "7FFFh" or "FF7Fh" is stored in the column latch circuit 29, all bits of latch data is "1" after the verifying operation. Therefore, in the first embodiment, the security function is deactivated even though the password and the security function deactivation code are not identical. In this case, since not all bits of the input data (latch data) is data "1", even if the prohibited data detection circuit configured as shown in FIG. 10A is used, it is impossible to detect the password as the prohibited data. Consequently, the security function is adversely deactivated irrespective of the security function deactivation code stored in memory cells. To cope with this, in the second embodiment, the prohibited data detection circuit configured as shown in FIG. 10B is provided so as to detect that the data (latch data) "7FFFh" or "FF7Fh" is inputted as the password. Accordingly, the prohibited data detection circuit outputs a high-level prohibited data detection signal LDET, thus preventing the deactivation of the security function. If the prohibited data detection circuit configured as shown in FIG. 10B is used, it is possible to impose restrictions on the number of passwords that might deactivate the security function since this prohibited data detection circuit can detect not only two kinds of the latch data ("7FFFh" and "FF7Fh") but also the latch data "FFFFh".

As shown in FIG. 8F, if the password "7F7Fh" is stored in the column latch circuit 29, all bits of latch data is "1" after the verifying operation. Therefore, in the first embodiment, the security function is deactivated even though the password and the security function deactivation code are not identical. In this case, even if the prohibited data detection circuits configured as shown in FIGS. 10A and 10B are used, it is impossible to detect the password as the prohibited data, and therefore, the security function is adversely deactivated irrespective of the security function deactivation code stored in memory cells. To cope with this, the prohibited data detection circuit configured as shown in FIG. 10C is provided so as to detect that the data (latch data) "7F7Fh" is inputted as the password. Accordingly, the prohibited data detection circuit outputs a high-level prohibited data detection signal LDET, thus preventing the deactivation of the security function. If the prohibited data detection circuit configured as shown in FIG. 10C is used, it is possible to impose stricter restrictions on the number of passwords that might deactivate the security function since this prohibited data detection circuit can detect not only the latch data "7F7Fh" but also the latch data "FFFFh", "7FFFh" and "FF7Fh".

As shown in FIG. 8G, if the password "7777h" is stored in the column latch circuit 29, all bits of the latch data is "1" after the verifying operation. Therefore, in the first embodiment, the security function is deactivated even though the password and the security function deactivation code are not identical. In this case, even if the prohibited data detection circuits configured as shown in FIGS. 10A through 10C are used, it is impossible to detect the password as the prohibited data, and therefore, the security function is deactivated irrespective of the security function deactivation code stored in memory cells. To cope with this, in the second embodiment, the prohibited data detection circuit configured as shown in FIG. 10D is provided so as to detect that the data (latch data) "7777h" is inputted as the password. If the prohibited data detection circuit configured as shown in FIG. 10D is used, it is possible to impose stricter restrictions on the number of passwords that might deactivate the security function since this prohibited data detection circuit can detect not only the latch data "7777h" but also the latch data "FFFFh", "7FFFh", "FF7Fh" and "7F7Fh".

By eliminating the prohibited data detected by the prohibited data detection circuit from the security function deactivation code (password), it is possible to avoid the problem that the security function is not deactivated even though a proper password is inputted.

If the prohibited data detection circuit configured as shown in FIG. 10D, in particular, is provided in the present embodiment, the security function can be deactivated only when the data "5555h" identical to the security function deactivation code is inputted as the password. Specifically, the input latch data is divided into a plurality of groups as indicated by the dotted lines in FIG. 8H, and the prohibited data detection circuit is configured to detect that all bits of data in one of the groups is data "1". Therefore, considerably tight restrictions can be imposed on the number of passwords that might deactivate the security function, and thus the function of providing security can be further enhanced.

Method for Providing Security

Hereinafter, a method for providing security (method for deactivating a security function) for the nonvolatile semiconductor memory device (flash memory) of the second embodiment will be described in detail.

Figure 11:
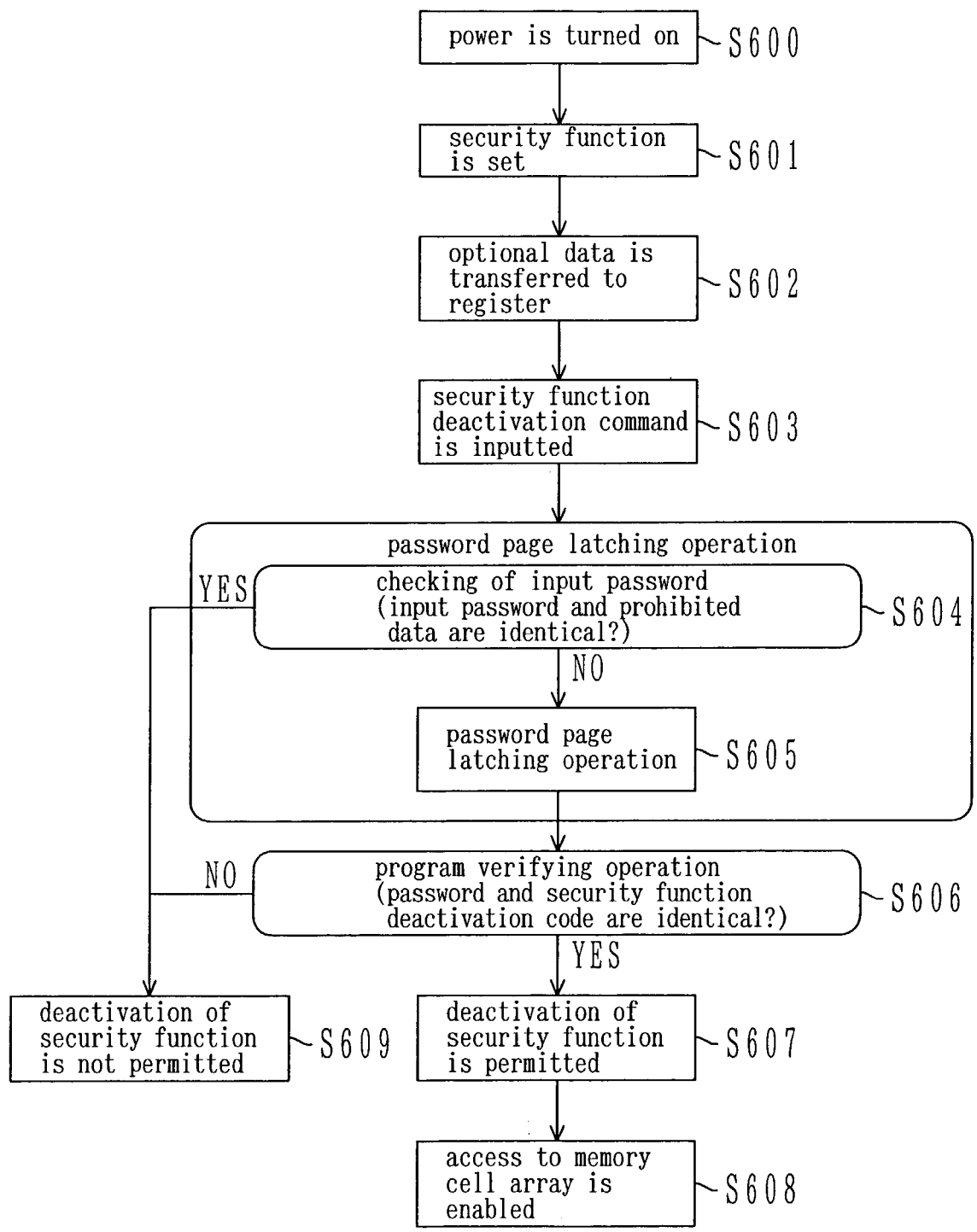
FIG. 11 is a flow chart illustrating the procedures of the security function deactivation method for the nonvolatile semiconductor memory device according to the second embodiment.

FIG. 11 is a flow chart illustrating the procedures of the security function deactivation method for the nonvolatile semiconductor memory device according to the second embodiment. It is to be noted that since the procedures carried out in steps S600 through S603 and steps S606 through S609 shown in FIG. 11 are similar to those carried out in steps S500 through S503 and steps S505 through S508 in the first embodiment shown in FIG. 6, the description thereof will be omitted. Hereinafter, the procedures carried out in steps S604 and S605 will be described.

If input of the security function deactivation command is detected in step S603, input of a password for deactivating the security function starts (i.e., the page latching operation on the password starts) in step S604. If the input password (input data or latch data) is fed to the prohibited data detection circuit 42 via the internal data buses DIN [0] to DIN [15], in step S604, the prohibited data detection circuit 42 determines whether or not the input data (latch data) is identical to the prohibited data (e.g., "FFFFh", "7FFFh", "FF7Fh", "7F7Fh" and "7777h").

If the answer in step S604 is YES, i.e., if the input password is identical to the prohibited data, the process goes to step S609 in which the deactivation of the security function is prevented, since the security function might be deactivated irrespective of the security function deactivation code stored in memory cells.

On the other hand, if the answer in step S604 is NO, i.e., if the input password is not identical to the prohibited data, the process goes to step S605 in which the page latching operation is performed to store the input password in the column latch circuit 29. In this case, a series of operations, i.e., checking of the input password and the page latching operation on the password, are performed for eight cycles, and thus 128-bit password is stored in the column latch circuit 29 via the input data terminals DI [0] to DI [15].

Next, only when the input password is never once identical to the prohibited data during eight cycles of checking of the input password and the password page latching operations, the verifying operation is performed in step S606 to determine whether the password, stored in the column latch circuit 29, is identical to the security function deactivation code, stored in the memory cells of the deactivation code storage 13. The procedures to be carried out after step S606 is similar to those carried out after step S505 in the first embodiment, and therefore, the description thereof will be omitted.

As described above, in the security method of the present embodiment, the prohibited data detection circuit 42 can be utilized to prevent the security function from being deactivated by a password that is not identical to the security function deactivation code stored in the memory cells. As a result, the function of providing security is further enhanced.

Timing Chart

Figure 12:
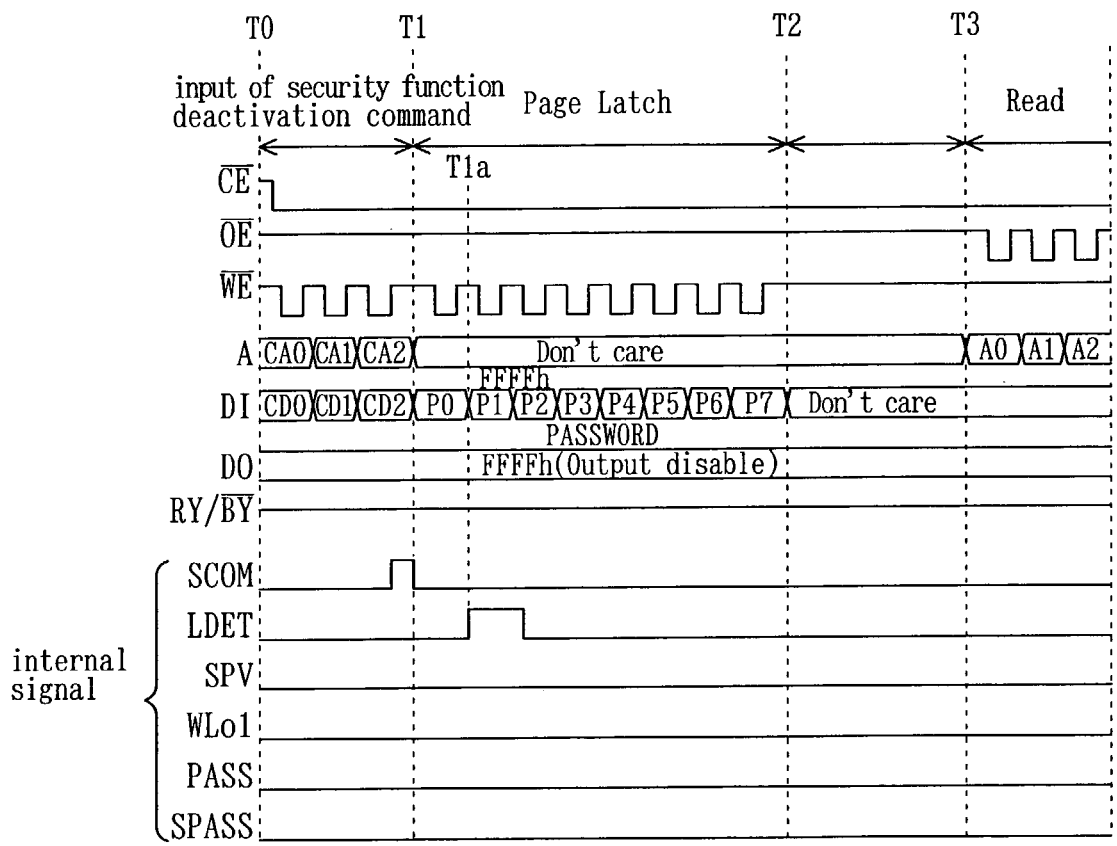
FIG. 12 is a timing chart illustrating the procedures of the security function deactivation method for the nonvolatile semiconductor memory device according to the second embodiment.

FIG. 12 is a timing chart illustrating the procedures of the security function deactivation method for the nonvolatile semiconductor memory device according to the second embodiment. Hereinafter, description will be made on the supposition that the prohibited data "FFFFh" is inputted the input password.

When the security function deactivation command is inputted at the time of T0, the command decoder 25 detects input of the security function deactivation command, and outputs a high-level signal SCOM (security function deactivation command detection signal) to the security control circuit 41.

Next, from the time T1 at which the security control circuit 41 has received the high-level signal SCOM, the password for deactivating the security function is inputted. The input password is fed to the prohibited data detection circuit 42 via the internal data buses DIN [0] to DIN [15], and the prohibited data detection circuit 42 determines whether or not the input password is identical to the prohibited data (e.g., "FFFFh", "7FFFh", "FF7Fh", "7F7Fh" and "7777h"). If "FFFFh", for example, is inputted as an input password "P1" in the second cycle of the page latching operation (at the time of T1$a$), the prohibited data detection circuit 42 detects that this inputted password is the prohibited data and outputs a high-level prohibited data detection signal LDET. On the other hand, if the input password is not identical to any of the prohibited data, the prohibited data detection circuit 42 outputs a low-level prohibited data detection signal LDET.

This high-level or low-level prohibited data detection signal LDET is inputted to the security control circuit 41. Once the security control circuit 41 has received the high-level prohibited data detection signal LDET, even if the page latching operation is performed for eight cycles, the security authentication verifying signal SPV is never placed at a high level. Therefore, after the time T2, the verifying operation for determining whether or not the input password is identical to the security function deactivation code does not start. Accordingly, the security function will not be deactivated. In this case, even if a read operation is performed after the time T3, memory cell data cannot be read out, and only "FFFFh" is invariably outputted via the data output terminals DO [0] to DO [15].

As described above, since the nonvolatile semiconductor memory device (flash memory) of the present embodiment is provided with the prohibited data detection circuit 42, it is possible to prevent the security function from being deactivated by a password that is not identical to the security function deactivation code stored in the memory cells. In the present embodiment, all bits of the input data or latch data are organized into a group or divided into two or more groups, and the prohibited data detection circuit 42 is configured to detect that all bits of the data in one of the groups is data "1". Therefore, considerably tight restrictions can be imposed on passwords that might deactivate the security function. Consequently, the function of providing security can be further enhanced.

In the present embodiment, when the prohibited data is detected, access to the memory cell array from outside is disabled by prohibiting the verifying operation to be performed after the completion of the operation of latching a password in the column latch circuit. However, other methods may be employed. Alternatively, when the prohibited data is detected, the operation of latching a password in the column latch circuit is not permitted. Optionally, when the prohibited data is detected, access to the memory cells may be prohibited even if the password and the security function deactivation code are determined to be identical after the operation of latching the password in the column latch circuit and the verifying operation have been performed.

(Third Embodiment)

In the first and second embodiments, when the security function deactivation command is inputted, a password for deactivating the security function is inputted by performing the page latching operation, and then the verifying operation is performed to whether or not the password is identical to the security function deactivation code. And if the password and the security function deactivation code are identical, the security function is deactivated. The security is ensured in this manner in the first and second embodiments. In the first and second embodiments, each of the settings of the address terminal A during the page latching operation, the address terminal A during the verifying operation, and the data input terminal DI during the verifying operation is an arbitrary setting "Don't Care".

In the third embodiment, the nonvolatile semiconductor memory device is provided with a means for detecting that a specified address is inputted before the page latching operation, and for detecting that the specified address and specified data are inputted before the verifying operation. In the present embodiment, even if the security function deactivation command is inputted and then the password identical to the security function deactivation code is inputted (i.e., the prohibited data is not inputted), the security function is not deactivated unless the specified address is inputted at the time of the page latching operation and the specified address and specified data are inputted at the time of the verifying operation.

In the present embodiment, the specified address detected at the time of the page latching operation, and the specified address and specified data detected at the time of the verifying operation are determined by the values stored in the register. Thus, since the values of the specified address and specified data can be arbitrarily set, the function of providing security can be further enhanced.

Circuit Configuration and Operation

Figure 13:
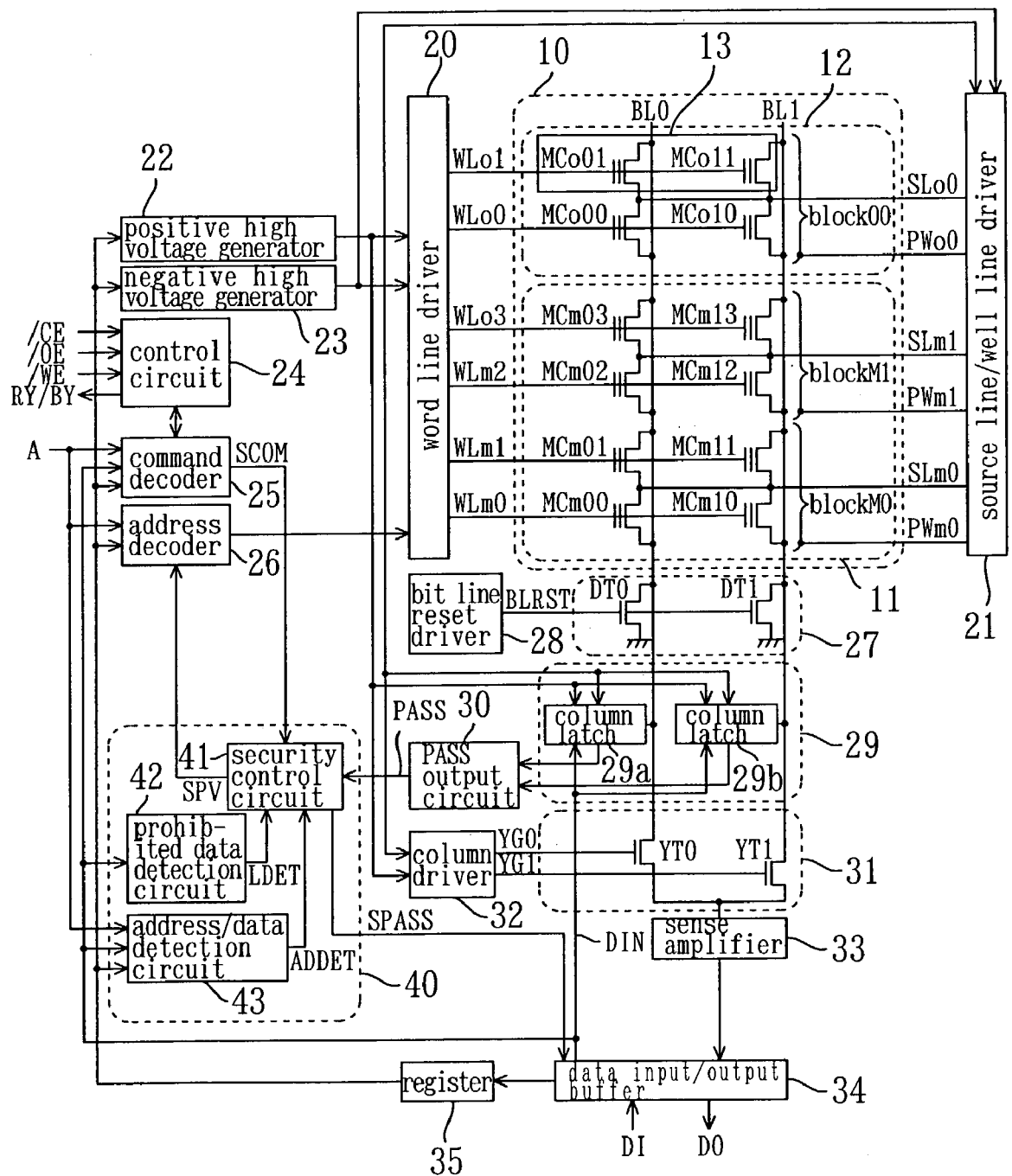
FIG. 13 is a circuit diagram showing the configuration of a nonvolatile semiconductor memory device according to a third embodiment.

FIG. 13 is a circuit diagram showing the configuration of the nonvolatile semiconductor memory device (flash memory) according to the third embodiment. In the memory device shown in FIG. 13, the same components as the counterparts described in the second embodiment (see FIG. 9) are identified by the same reference characters, and the description thereof will be omitted. Only the components that are not provided in the memory device shown in FIG. 9 will be described below.

As shown in FIG. 13, in the nonvolatile semiconductor memory device of the present embodiment, an address/data detection circuit 43 is provided in addition to the security control circuit 41 and the prohibited data detection circuit 42. The input section of the address/data detection circuit 43 is connected to the output sections of the address terminal A, the internal data bus DIN and the register 35. The address/data detection circuit 43 receives outputs from the address terminal A, the internal data bus DIN and the register 35. And if the address/data detection circuit 43 detects input of the specified address at the time of the page latching operation and permits the latching operation, or if the address/data detection circuit 43 detects input of the specified address and specified data at the time of the verifying operation and permits the verifying operation, then the address/data detection circuit 43 outputs a high-level address/data detection signal ADDET (first and second specified data detection signal) to the security control circuit 41.

In the present embodiment, the specified address detected at the time of the page latching operation, and the specified address and specified data detected at the time of the verifying operation are determined by specified address/specified data information (not shown) stored in the register 35. Further, the prohibited data of the third embodiment is similar to that of the second embodiment. Accordingly, the specified address detected at the time of the page latching operation and the specified address and specified data detected at the time of the verifying operation can be modified whenever necessary by changing the value of information stored in the register 35, i.e., by changing the specified address/specified data information stored in advance in the optional region 12. In such an embodiment, since the specified address and specified data can be arbitrarily set and/or modified for each user or for each chip, it is difficult for a malicious third party to read the specified address and specified data. As a result, the function of providing security can be further enhanced.

Although the nonvolatile semiconductor memory device of the present embodiment includes the prohibited data detection circuit 42 described in the second embodiment, the third embodiment does not necessarily require the prohibited data detection circuit 42. Just the addition of the address/data detection circuit 43 to the memory device of the first embodiment can improve the security function.

Method for Providing Security

Hereinafter, a method for providing security (method for deactivating a security function) for the nonvolatile semiconductor memory device (flash memory) of the present embodiment will be described in detail.

Figure 14:
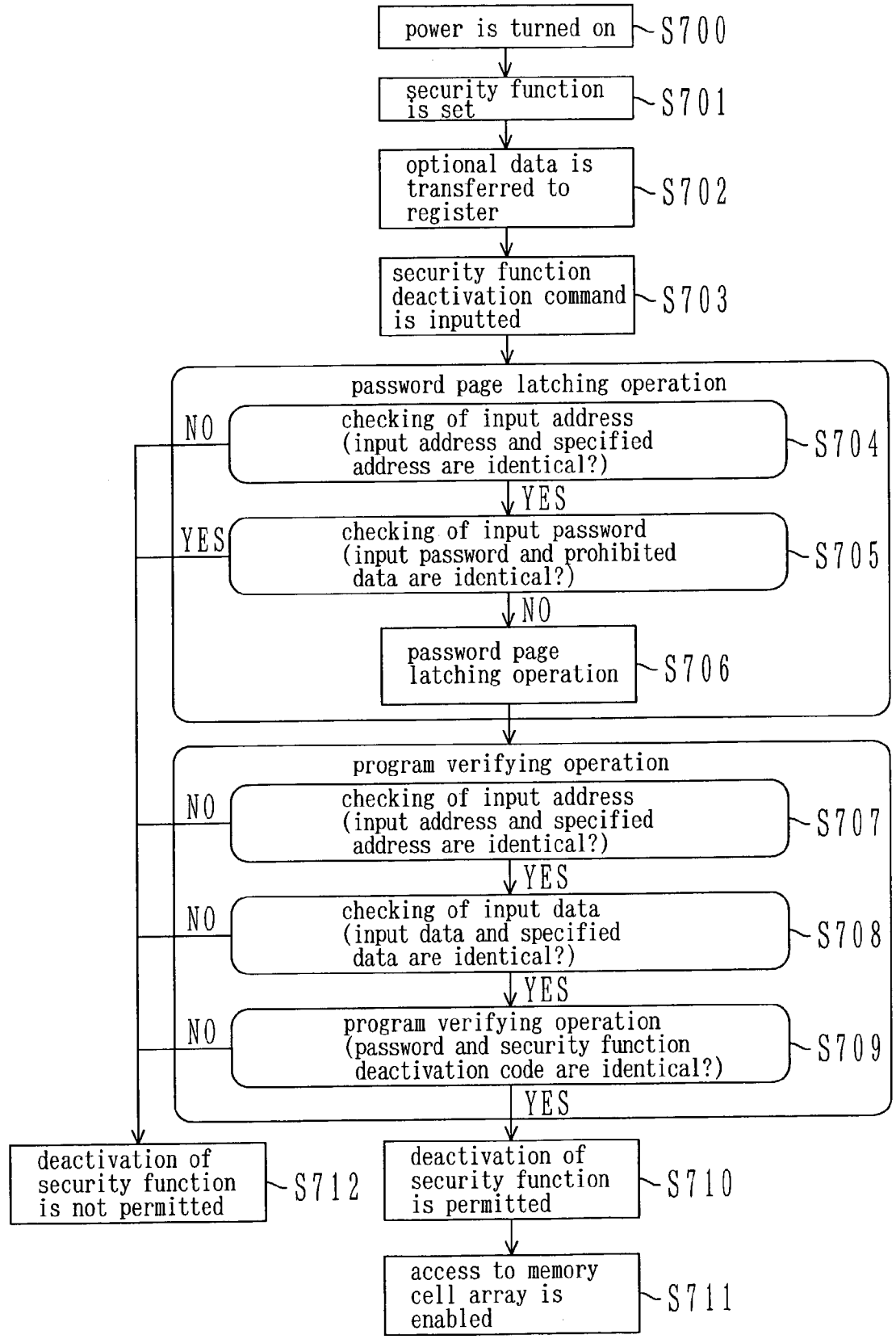
FIG. 14 is a flow chart illustrating the procedures of the security function deactivation method for the nonvolatile semiconductor memory device according to the third embodiment.

FIG. 14 is a flow chart illustrating the procedures of the security function deactivation method for the nonvolatile semiconductor memory device according to the third embodiment. It is to be noted that since the procedures carried out in steps S700 through S703 shown in FIG. 14 are similar to those carried out in steps S500 through S503 in the first embodiment shown in FIG. 6 (steps S600 through S603 in the second embodiment), the description thereof will be omitted. Hereinafter, the procedures to be carried out after step S704 will be described.

If input of the security function deactivation command is detected in step S703, input of the password for deactivating the security function starts (i.e., the page latching operation on the password starts) in step S704. First, if the address inputted through the address terminal A is fed to the address/data detection circuit 43, the address/data detection circuit 43 determines whether or not the input address is identical to the specified address.

Then, if the answer in step S704 is YES, i.e., if it is determined that the input address is identical to the specified address, the process goes to step S705 in which the input password is checked. Since the checking of the input password is similar to the procedure carried out in step S604 in the second embodiment shown in FIG. 11, the detailed description thereof will be omitted.

If the answer in step S705 is NO, i.e., if it is determined that the input password is not identical to the prohibited data as a result of the checking of the input password, the process goes to step S706 in which the page latching operation is performed to store the input password in the column latch circuit 29. In this case, a series of operations, i.e., the checking of the input address, the checking of the input password, and the password page latching operation, are performed for eight cycles, and thus 128-bit password is stored in the column latch circuit 29 via the input data terminals DI [0] to DI [15].

On the other hand, if the answer in step S704 is NO, i.e., if it is determined that the input address is not identical to the specified address, the process goes to step S712. And if the answer in step S705 is YES, i.e., if it is determined that the input password is identical to the specified data, the process goes to step S712. In either case, the security function is not deactivated.

Suppose it is determined that the input address is identical to the specified address and that the input password is never once identical to the prohibited data in steps S704 and S705 by carrying out the checking of the input address, the checking of the input password, and the password page latching operation for eight cycles. Only in that case, the process goes to step S707 to starts the verifying operation for determining whether or not the password stored in the column latch circuit 29 is identical to the security function deactivation code stored in the memory cells of the deactivation code storage 13.

In the verifying operation, first, the address inputted via the address terminal A is fed to the address/data detection circuit 43, and the address/data detection circuit 43 determines whether or not the input address is identical to the specified address.

If the answer in step S707 is YES, i.e., if it is determined that the input address is identical to the specified address, the process goes to step S708 in which checking of the input data is performed. If the answer in step S708 is YES, i.e., if it is determined that the input data transmitted via the data input terminals DI [0] to DI [15] is identical to the specified data, the process goes to step S709 in which the verifying operation is performed to determine whether or not the password, stored in the column latch circuit 29, is identical to the security function deactivation code, stored in the memory cells of the deactivation code storage 13. If the answer in step S709 is YES, i.e., if it is determined that the password is identical to the security function deactivation code as a result of the verifying operation, the process goes to step S710 in which the security function is deactivated, and then the process goes to step S711 in which access to the memory cell array from outside is enabled.

On the other hand, if the answer is NO in any one of steps S707, S708 and S709, the process goes to step S712 in which the deactivation of the security function is not permitted.

As described above, in the security method of the present embodiment, the security function is eventually not deactivated unless the specified address is inputted at the time of the page latching operation and the specified address and specified data are inputted at the time of the verifying operation. Consequently, the function of providing security can be further enhanced.

Timing Chart

Figure 15:
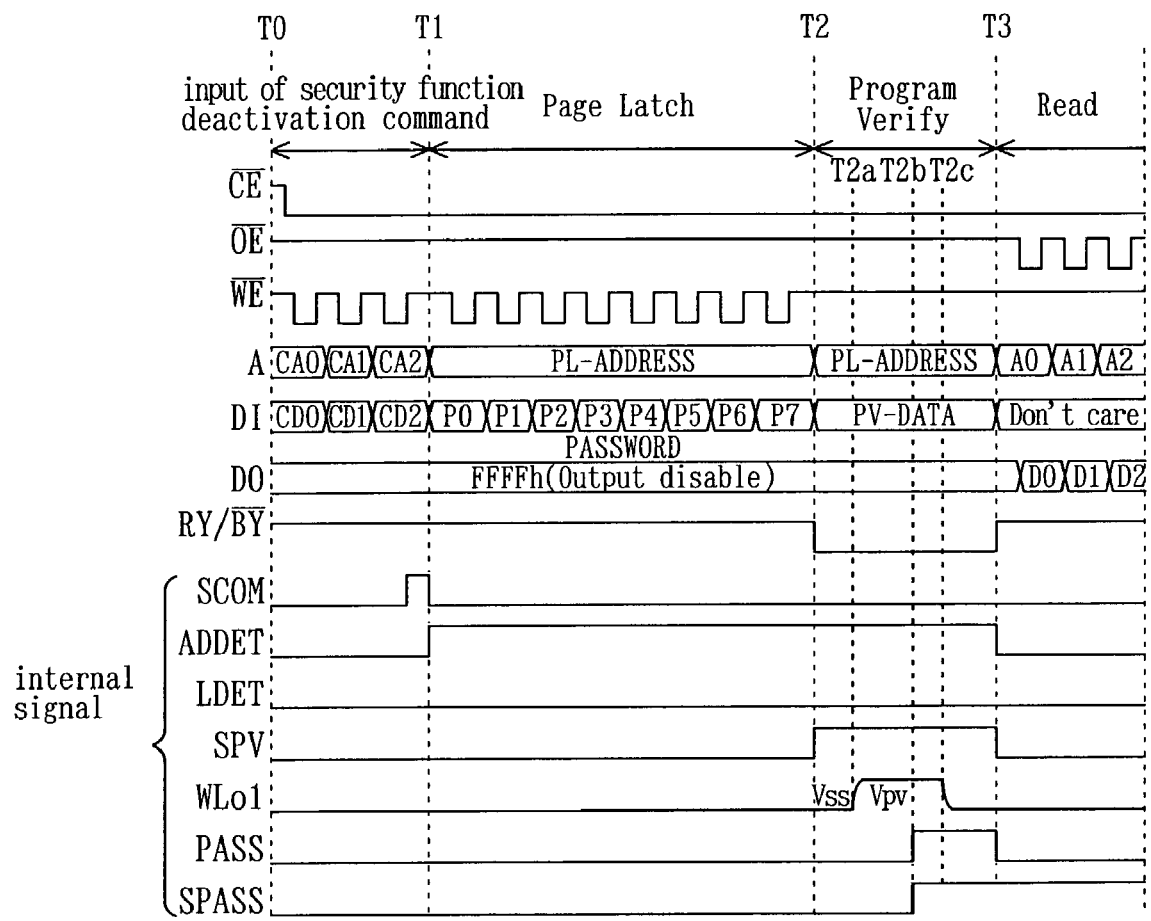
FIG. 15 is a timing chart illustrating the procedures of the security function deactivation method for the nonvolatile semiconductor memory device according to the third embodiment.

FIG. 15 is a timing chart illustrating the procedures of the security function deactivation method for the nonvolatile semiconductor memory device according to the third embodiment.

If the security function deactivation command is inputted at the time of T0, the command decoder 25 detects input of the security function deactivation command, and outputs a high-level signal SCOM (security function deactivation command detection signal) to the security control circuit 41.

Next, from the time T1 at which the security control circuit 41 has received the high-level signal SCOM, the password for deactivating the security function is inputted. The input address "PL-ADDRESS" through the address terminal A is fed to the address/data detection circuit 43, and the address/data detection circuit 43 determines whether or not the input address is identical to the specified address. If it is determined that the input address is identical to the specified address, the address/data detection circuit 43 outputs a high-level address/data detection signal ADDET to the security control circuit 41.

At the same time, the input password is fed to the prohibited data detection circuit 42 via the internal data buses DIN [0] to DIN [15], and the prohibited data detection circuit 42 determines whether or not the input password is identical to the prohibited data (e.g., "FFFFh", "7FFFh", "FF7Fh", "7F7Fh" and "7777h"). If "FFFFh", for example, is inputted as the input password in the page latching operation, the prohibited data detection circuit 42 detects this input password as the prohibited data and outputs a high-level prohibited data detection signal LDET. On the other hand, if the input password is not identical to any of the prohibited data, the prohibited data detection circuit 42 outputs a low-level prohibited data detection signal LDET.

This high-level or low-level prohibited data detection signal LDET is inputted to the security control circuit 41. Once the security control circuit 41 has received the high-level prohibited data detection signal LDET, even if the page latching operation is performed for eight cycles, the security authentication verifying signal SPV is never placed at a high level. Therefore, after the time T2, the verifying operation for determining whether or not the input password is identical to the security function deactivation code does not start. As a result, the security function will not be deactivated. In this case, even if a read operation is performed after the time T3, memory cell data cannot be read out, and only "FFFFh" is invariably outputted via the data output terminals DO [0] to DO [15].

Furthermore, only when the high-level address/data detection signal ADDET and low-level prohibited data detection signal LDET are inputted to the security control circuit 41, the input password is stored in the column latch circuit 29. These operations are performed for eight cycles.

Suppose the password page latching operation is performed for eight cycles with the high-level address/data detection signal ADDET and low-level prohibited data detection signal LDET inputted to the security control circuit 41. In that case, after the time T2, the security control circuit 41 outputs a high-level SPV signal, the ready/busy signal RY/BY is placed at a low level and put into a busy state, and the verifying operation is performed to determine whether or not the password, stored in the column latch circuit 29, is identical to the security function deactivation code, stored in the memory cells of the deactivation code storage 13. During the verifying operation, input address "PV-ADDRESS" and input data "PV-DATA" are fed to the address/data detection circuit 43, and the address/data detection circuit 43 determines whether or not the input address and input data are identical to the specified address and specified data. If the input address and input data are identical to the specified address and specified data, respectively, the address/data detection circuit 43 outputs a high-level address/data detection signal ADDET to the security control circuit 41. In this manner, the verifying operation as described in the first embodiment is performed. If it is determined that the password is identical to the security function deactivation code as a result of the verifying operation, at the time of T2b, the PASS output circuit 30 outputs a high-level PASS signal and the security control circuit 41 outputs a high-level SPASS signal, thereby deactivating the security function. Consequently, after the time T3, access to the memory cell array from outside is enabled.

On the other hand, if the specified address has not been inputted at the time of the page latching operation, or if the specified address and specified data have not been inputted at the time of the verifying operation, the address/data detection circuit 43 outputs a low-level address/data detection signal ADDET to the security control circuit 41, and thus the security function is not deactivated.

In the nonvolatile semiconductor memory device of the present embodiment, since the address/data detection circuit 43 is provided, the security function is not deactivated unless the specified address is inputted at the time of the page latching operation and the specified address and specified data are inputted at the time of the verifying operation. As a result, the function of providing security can be further enhanced.

Besides, in the third embodiment, the values of the specified address and specified data to be detected may be determined by the specified address/specified data information stored in the register 35. In such an embodiment, the specified address and specified data to be detected can be modified whenever necessary by changing the value of information stored in the register 35, i.e., by changing the specified address/specified data information stored in advance in the optional region 12. Furthermore, in such an embodiment, since the specified address and specified data can be arbitrarily set and/or modified for each user or for each chip, it is difficult for a malicious third party to read the specified address and specified data. As a result, the function of providing security can be further enhanced.

In the third embodiment, at the time of the page latching and verifying operations, the following three pieces of data are detected: a specified address (1) detected at the time of the page latching operation; a specified address (2) detected at the time of the verifying operation; and specified data (3) detected at the time of the verifying operation. Alternatively, any one or two of the three pieces of data (1), (2) and (3) may be detected.

(Fourth Embodiment)
Circuit Configuration and Operation

Figure 16:
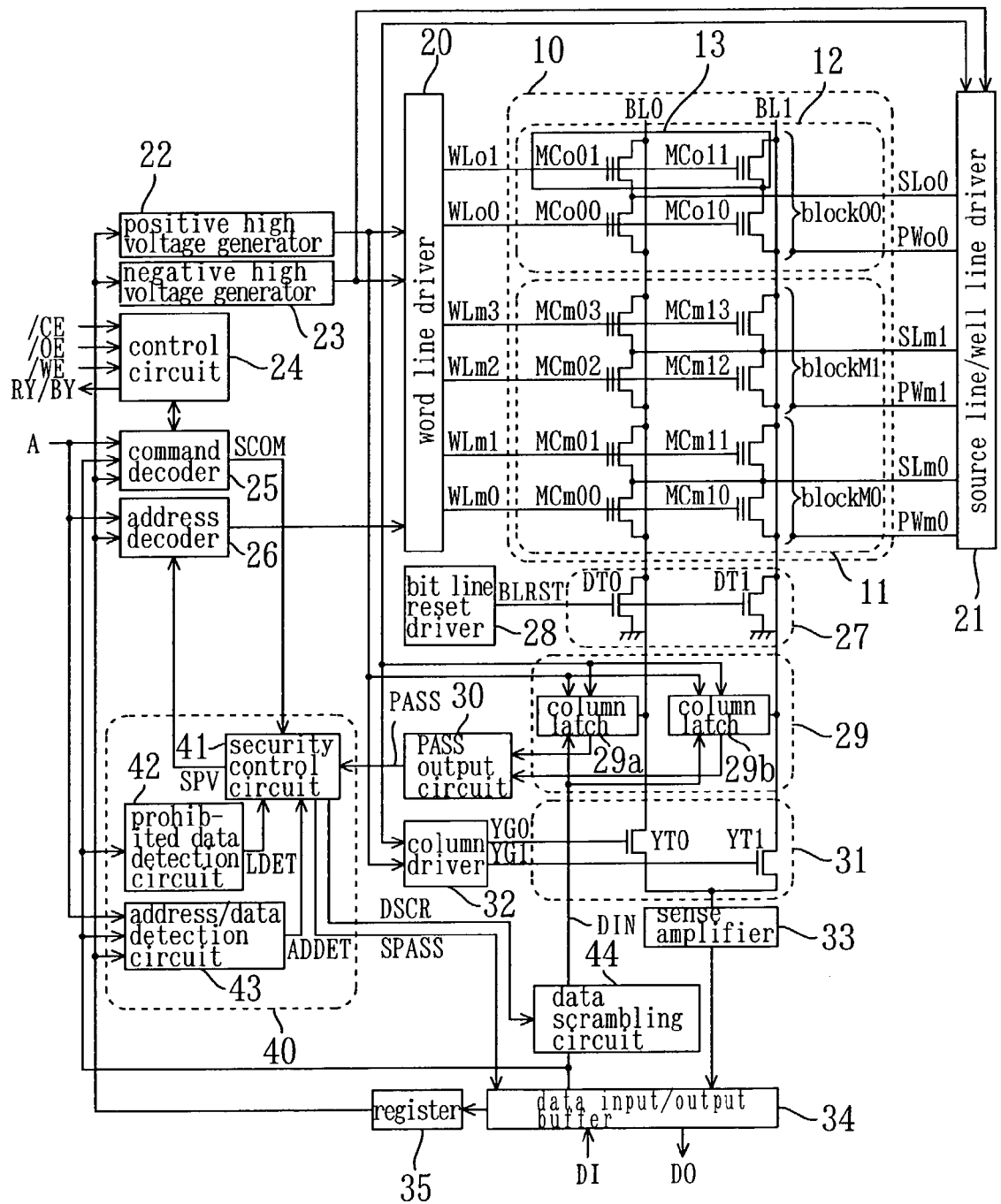
FIG. 16 is a circuit diagram showing the configuration of a nonvolatile semiconductor memory device according to a fourth embodiment.

FIG. 16 is a circuit diagram showing the configuration of a nonvolatile semiconductor memory device (flash memory) according to a fourth embodiment. In the memory device shown in FIG. 16, the same components as the counterparts described in the third embodiment (see FIG. 13) are identified by the same reference characters, and the description thereof will be omitted. Only the components that are not provided in the memory device shown in FIG. 13 will be described below.

As shown in FIG. 16, in the nonvolatile semiconductor memory device of the present embodiment, a data scrambling circuit 44 is provided in addition to the security control circuit 41, prohibited data detection circuit 42 and address/data detection circuit 43. The data scrambling circuit 43 is located between the data input/output buffer 34 and the column latch circuit 29, and functions as a circuit for scrambling data inputted through the data input data terminal DI and for outputting the scrambled data. As used herein, "data scrambling" means random interchanging of respective bits of the input data. The data scrambling circuit 44 is controlled by a data scrambling signal DSCR outputted from the security control circuit 41.

Hereinafter, the data scrambling will be described.

Suppose the security function deactivation command is inputted and then the password for deactivating the security function is inputted by carrying out the page latching operation. In that case, the security control circuit 41 outputs a high-level data scrambling signal DSCR to the data scrambling circuit 44. Upon receipt of the high-level data scrambling signal DSCR, the data scrambling circuit 44 scrambles the data inputted through the data input data terminal DI and outputs the scrambled data to the column latch circuit 29. It is to be noted that the data scrambling is performed only when the security function deactivation command is inputted and the password for deactivating the security function is inputted. Therefore, during the page latching operation for a normal write operation, the data scrambling is not performed.

After the password has been stored in the column latch circuit 29, the verifying operation is performed to determine whether or not the password is identical to the security function deactivation code. Even if the password and the security function deactivation code are determined to be identical as a result of the verifying operation, how to perform the data scrambling has to be known beforehand in order to deactivate the security function. In other words, the security function cannot be deactivated even if it is determined that the password and the security function deactivation code are identical as a result of the verifying operation, unless the password is inputted with the understanding of the data scrambling.

In the nonvolatile semiconductor memory device of the fourth embodiment, even in the event that a malicious third party has read the security function deactivation code by some means and inputted the read data as the password, the security function cannot be deactivated because the input password is scrambled by the data scrambling circuit 44 and stored in the column latch circuit 29.

As described above, in the fourth embodiment, the addition of the data scrambling circuit 44 can further improve the function of providing security.

Although the memory device of the present embodiment is provided with the data scrambling circuit 44 in addition to the prohibited data detection circuit 42 and address/data detection circuit 43, the prohibited data detection circuit 42 and address/data detection circuit 43 are not necessarily required in the fourth embodiment. Alternatively, the memory device shown in FIG. 1 may be provided with the data scrambling circuit 44.

(Fifth Embodiment)

Circuit Configuration and Operation

Figure 17:
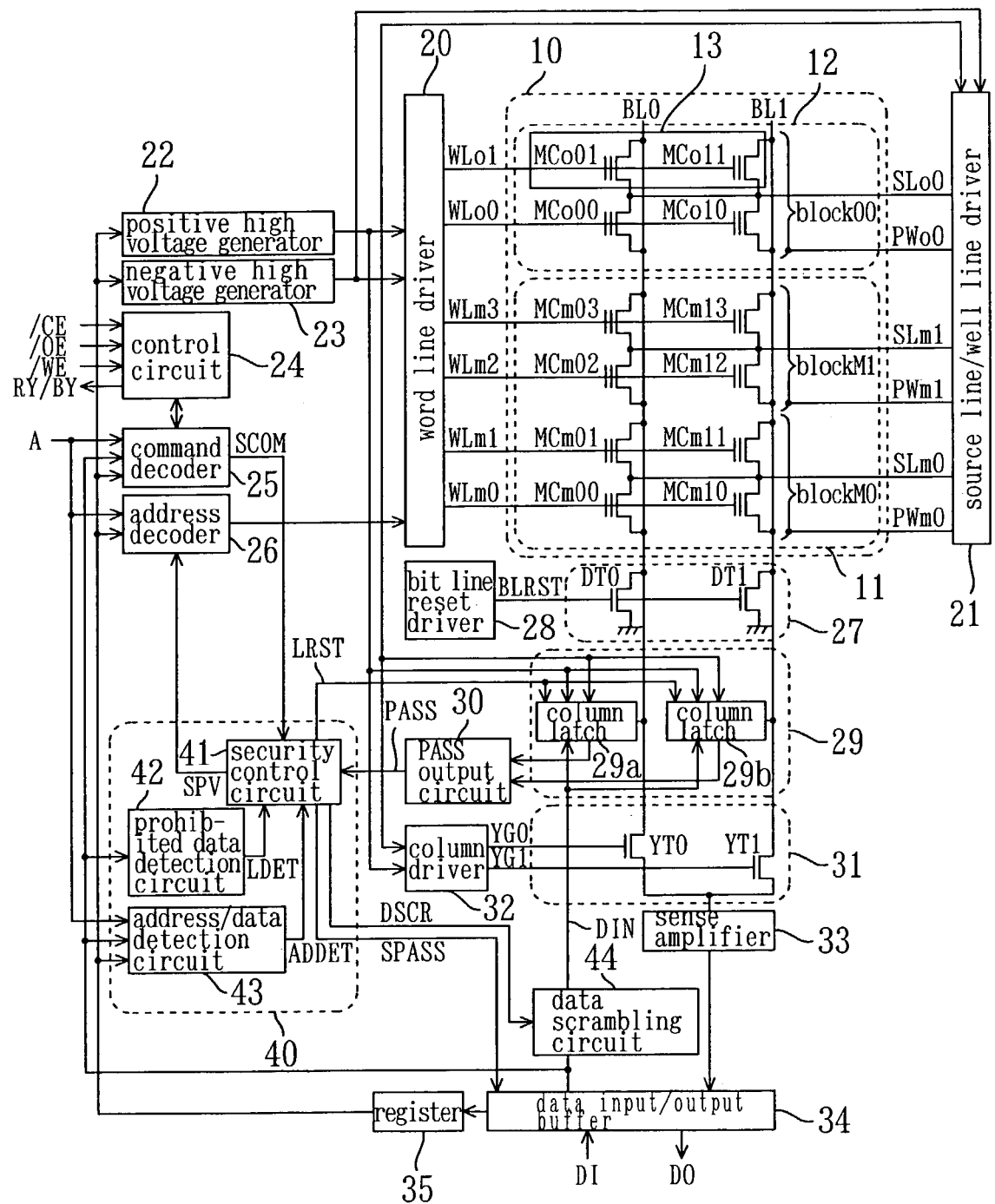
FIG. 17 is a circuit diagram showing the configuration of a nonvolatile semiconductor memory device according to a fifth embodiment.

FIG. 17 is a circuit diagram showing the configuration of a nonvolatile semiconductor memory device (flash memory) according to a fifth embodiment. In the memory device shown in FIG. 17, the same components as the counterparts described in the fourth embodiment (see FIG. 16) are identified by the same reference characters, and the description thereof will be omitted. Only the components that are not provided in the memory device shown in FIG. 16 will be described below.

As shown in FIG. 17, the nonvolatile semiconductor memory device of the present embodiment is provided with the security control circuit 41, prohibited data detection circuit 42, address/data detection circuit 43, and data scrambling circuit 44, like the third embodiment. Furthermore, in the nonvolatile semiconductor memory device of the present embodiment, the security control circuit 41 has a function of resetting latch data stored in the column latch circuit 29 if certain condition is satisfied. When the security control circuit 41 outputs a high-level latch-reset signal LRST to the column latch circuit 29, latch data in the column latch circuit 29 is reset by the high-level latch-reset signal LRST.

Hereinafter, a means for resetting latch data will be described. The latched data stored in the column latch circuit 29 might be read out by a third party who utilizes a method of placing a probe (so-called "chip probe method"), for example. To be more specific, a third party might obtain the latch data after the verifying operation, and might make predictions, based on the obtained data, about arithmetic for the verifying operation and about the security function deactivation code. The latch data resetting means of the present embodiment is provided in order to prevent this undesirable situation, and the following procedures are carried out for this purpose.

If it is determined that the password is not identical to the security function deactivation code in the verifying operation, the PASS output circuit 30 outputs a low-level PASS signal to the security control circuit 41. Then, the security control circuit 41 outputs a high-level latch-reset signal LRST to the column latch circuit 29. At this time, upon receipt of the high-level latch-reset signal LRST, all the latch data in the column latch circuit 29 is reset. Thereafter, the security function will not be deactivated.

In the nonvolatile semiconductor memory device of the present embodiment, if it is determined that the password is not identical to the security function deactivation code during the verifying operation, the function of resetting the latch data in the column latch circuit 29 is carried out. Thus, even if a random password from outside is inputted to the column latch circuit 29 to obtain the latch data after the verifying operation, only the reset latch data is obtained. In other words, the value of the latch data obtained when the security authentication verifying operation has not been successfully performed is only the reset data. Consequently, it is difficult for a malicious third party to read the security function deactivation code, thus further enhancing the function of providing security.

(Sixth Embodiment)

Hereinafter, a sixth embodiment of the present invention will be described with reference to the drawings. In the present embodiment, the security function is deactivated by using the same configurations and procedures as in the foregoing first through fifth embodiments. However, the sixth embodiment is characterized by providing a reference level for verifying security authentication. This reference level will be herein called a "security authentication verifying reference level".

Figure 18:
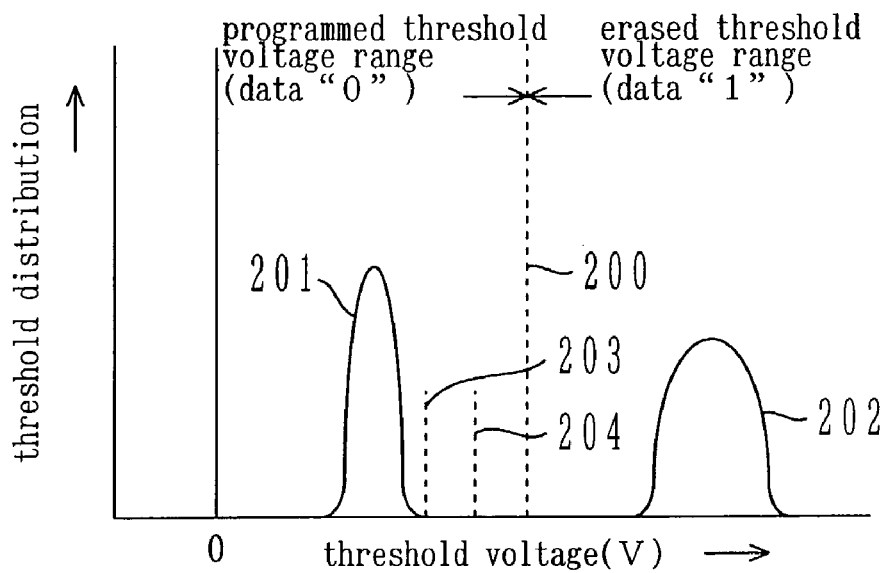
FIG. 18 is a graph showing the threshold value distribution of a memory cell used in a nonvolatile semiconductor memory device according to a sixth embodiment.

FIG. 18 is a graph showing the distribution of the threshold voltage of a memory cell used in a nonvolatile semiconductor memory device (flash memory) according to the sixth embodiment. As already described with reference to FIG. 3, if each memory cell of the nonvolatile semiconductor memory device is in the erased state in which electrons are injected to the floating gate of the memory cell transistor (see the threshold value distribution 202 in the normal erased state), the threshold voltage of the memory cell is higher than that of a memory cell in the programmed state in which electrons are ejected from the floating gate of the memory cell transistor (see the threshold value distribution 201 in the normal programmed state). Accordingly, the read operation reference level 200 defined at the midpoint between the threshold value distributions 201 and 202 is referenced in order to determine that the data stored in the memory cell is "0" or "1". Further, in the verifying operation, the normal program verifying reference level 203 is defined between the read operation reference level 200 and the programmed-state threshold value distribution 201, thus preventing an erroneous read operation caused by insufficient ejection of electrons.

Figure 19:
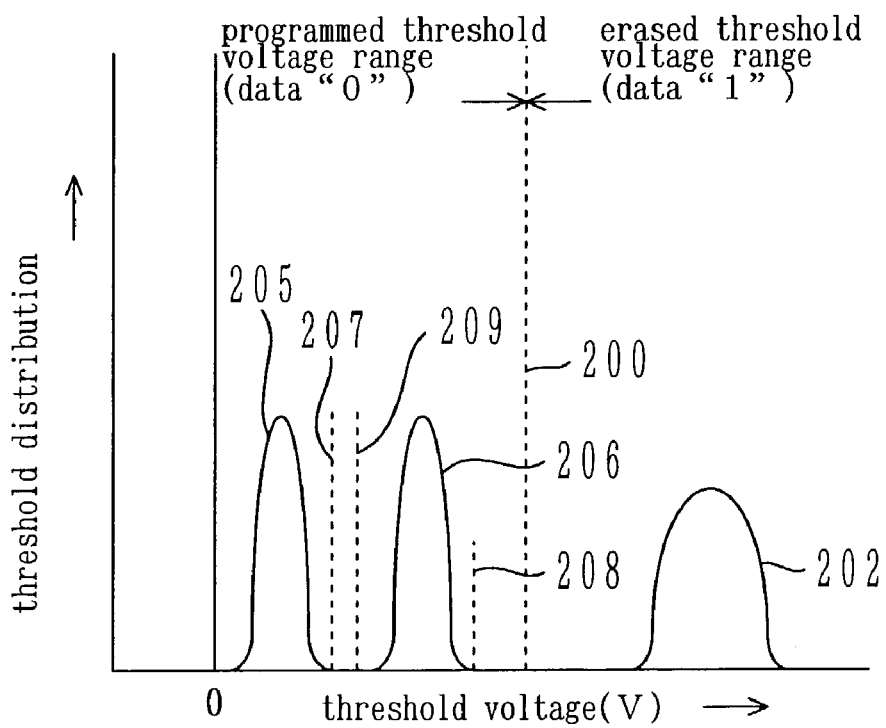
FIG. 19 is a graph showing the threshold value distribution of a memory cell used in a nonvolatile semiconductor memory device according to a seventh embodiment.
Figure 20:
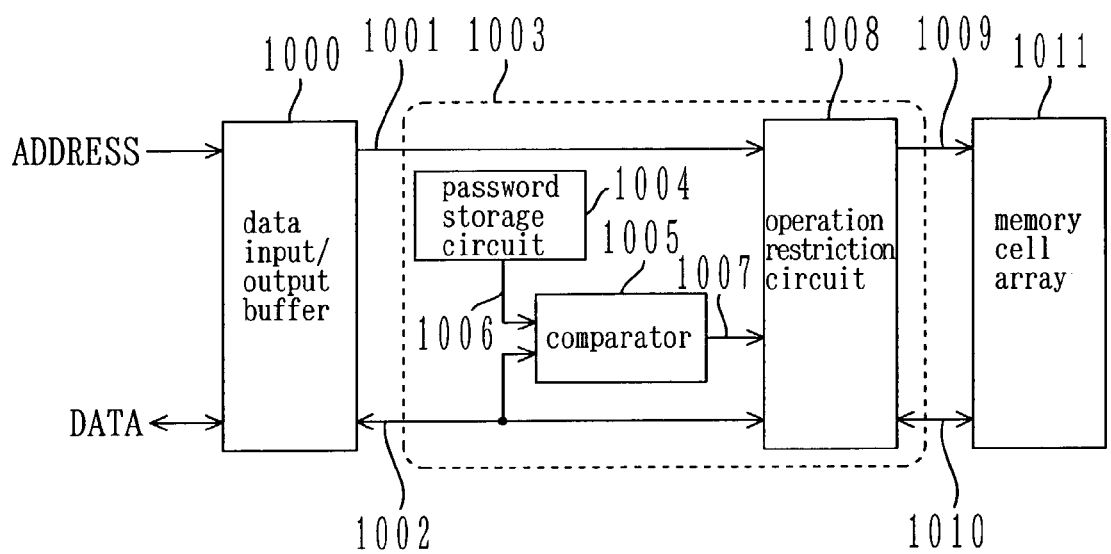
FIG. 20 is a circuit diagram showing the configuration of a conventional nonvolatile semiconductor memory device.
Figure 21:
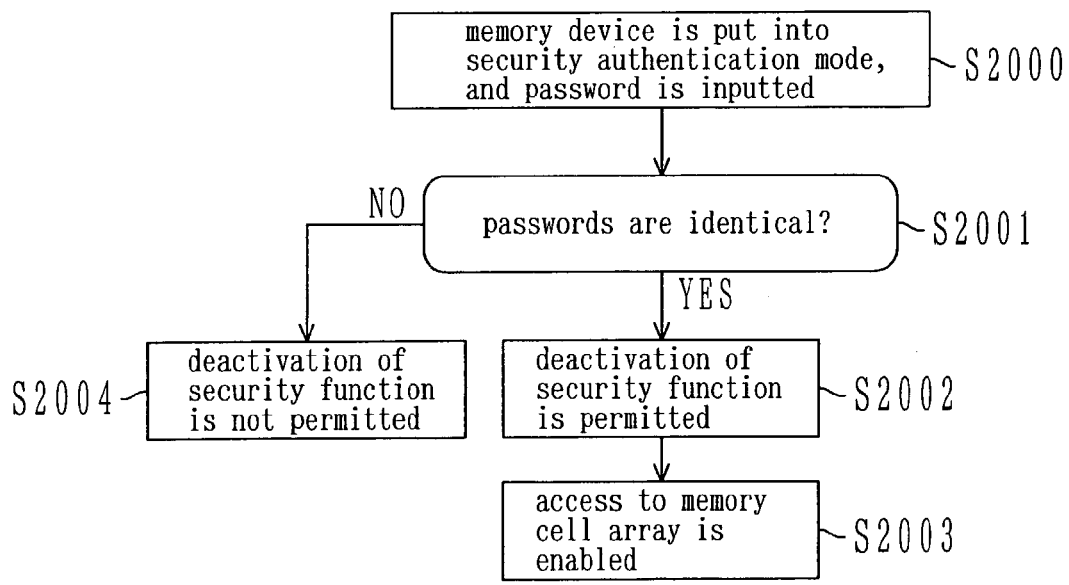
FIG. 21 is a flow chart illustrating a method for deactivating a security function for the conventional nonvolatile semiconductor memory device.

It is to be noted that in each of the graphs in FIGS. 3, 18 and 19, the left-hand side of the graph representing the threshold value of a normal memory cell in the programmed state will be herein called a "programmed threshold voltage range" and the right-hand side of the graph representing the threshold value of a normal memory cell in the erased state will be herein called an "erased threshold voltage range". In the present embodiment, in order to determine the level of the threshold voltage in the security authentication verifying operation, the security authentication verifying reference level 204 is positioned closer to the erased threshold voltage range than the normal verifying reference level 203 as shown in FIG. 18. In other words, the present embodiment is characterized by the position of the security authentication verifying reference level 204. By defining the security authentication verifying reference level 204 in this manner, the effects as described below are achieved.

The threshold value distribution of the memory cell shifts toward the programmed threshold voltage range or the erased threshold voltage range with the passage of time. For example, the threshold voltage of the programmed memory cell shifts toward the erased threshold voltage range with the passage of time. This shift is caused as follows.

In a read operation, a positive voltage (about 3.6 V), a ground voltage, and a voltage of about 1 V are applied to the control gate, source, and drain of the memory cell transistor from which data is to be read out, respectively. In this case, the memory cell suffers stress because a positive voltage (about 3.6 V) is also applied to the control gate of the other memory cell connected to the same line as the memory cell from which data is to be read out (that is, gate disturb occurs during the read operation). Due to such a stress voltage, electrons are injected to the floating gate during the read operation, and the state of the memory cell shifts from a sufficiently written state to a slightly written state, and as a result the threshold voltage thereof increases. Therefore, as the read operation is performed for a long period of time, the threshold voltage of the programmed memory cell increases, thus shifting the threshold voltage toward the erased threshold voltage range. The normal verifying operation during a write operation is carried out immediately after the programming operation. However, in some cases, the security authentication verifying operation is not carried out immediately after the programming operation but carried out after sufficient time has passed after the completion of the programming operation. Accordingly, the threshold voltage of the deactivation code storing memory cell on which the security authentication verifying operation is performed is likely to be shifted toward the erased threshold voltage range.

Suppose the threshold value distribution of the memory cells of the deactivation code storage 13 is shifted toward the normal-erased-state threshold value distribution 202 as described above. In that case, if the security authentication verifying operation is performed with reference to the normal verifying reference level 203, an erroneous determination might be made because a memory cell having a threshold voltage exceeding the normal verifying reference level 203 might exist. Such an erroneous determination is detrimental to the reliability of the security.

To cope with this, the shift of the threshold value distribution is taken into account in the present embodiment, and therefore, the security authentication verifying reference level 204 is positioned closer to the erased threshold voltage range than the normal verifying reference level 203. Accordingly, it is possible to suppress the occurrence of erroneous determination in the security authentication verifying operation, and thus it is possible to perform the security authentication verifying operation with a higher degree of accuracy.

(Seventh Embodiment)

Hereinafter, a seventh embodiment of the present embodiment will be described with reference to the drawings. In the present embodiment, the security function is deactivated by using the same configurations and procedures as in the foregoing first through fifth embodiments. However, the seventh embodiment is characterized by the security authentication verifying reference level and threshold value distributions of memory cells for storing a security function deactivation code.

FIG. 19 is a graph showing the threshold value distribution of memory cells used in a nonvolatile semiconductor memory device (flash memory) according to the seventh embodiment. In FIG. 19, although the threshold value distribution 201 of the normal programmed memory cell is not shown, the threshold value distribution 201 actually exists as shown in FIG. 18. It is to be noted that in FIG. 19, there exist a threshold value distribution 205 of a programmed memory cell (deactivation code storing memory cell) in the deactivation code storage 13, and a threshold value distribution 206 of an erased memory cell (deactivation code storing memory cell) in the deactivation code storage 13. The seventh embodiment is characterized in that the threshold value distributions 205 and 206 are both located below the read operation reference level 200, that is, the threshold value distributions 205 and 206 are both located in the same threshold voltage range (i.e., programmed threshold voltage range) as the threshold value distribution 201 of the normal programmed memory cell (see FIGS. 3 and 18). Furthermore, the threshold value distribution 205 is lower than the threshold value distribution 206.

In order to store data in the memory cell in the deactivation code storage 13 so that the threshold value distributions 205 and 206 are obtained as described above, the following measures are taken.

Suppose the security function deactivation code is written in the memory cell (deactivation code storing memory cell) in the deactivation code storage 13. In that case, when the deactivation code storing memory cell is put into the programmed state, a program verifying reference level 207 is used as a threshold voltage reference level for verifying whether the deactivation code storing memory cell is in the programmed state; on the other hand, when the deactivation code storing memory cell is put into the erased state, an erase verifying reference level 208 is used as a threshold voltage reference level for verifying whether the deactivation code storing memory cell is in the erased state. Since the security function deactivation code is written in this manner, the threshold value distributions 205 and 206 are both set in the programmed threshold voltage range.

During the security authentication verifying operation performed on the deactivation code storing memory cell having the above-described threshold voltage distributions, reference is made to a reference threshold voltage (reference level 209 for verifying security authentication) set at a value between the threshold value distribution 205 and the threshold value distribution 206. To be more specific, in order to set the reference voltage at the reference level 209 during the security authentication verifying operation, a predetermined voltage is supplied from the positive high voltage generator 22 to the word line driver 20 and is then applied to the word line WLo1 connected to the memory cells of the deactivation code storage 13.

As described above, the threshold voltage of the deactivation code storing memory cell in the programmed state, and that of the deactivation code storing memory cell in the erased state are both set at the threshold voltage of the normal memory cell in the programmed state. Therefore, even if a malicious third party has read the security function deactivation code by some means, the read out data is all programmed-state data because the security function deactivation code stored in the deactivation code storing memory cells is the programmed-state data of the normal memory cell without exception. As a result, it is difficult for a third party to read the security function deactivation code, thus further enhancing the function of providing security.

In the present embodiment, the threshold voltage of the deactivation code storing memory cell in the programmed state, and that of the deactivation code storing memory cell in the erased state are both set in the programmed threshold voltage range of the normal memory cell. Alternatively, the threshold voltage of the deactivation code storing memory cell in the programmed state, and that of the deactivation code storing memory cell in the erased state may both be set in the erased threshold voltage range of the normal memory cell.

In the foregoing, the first through seventh embodiments of the present invention have been described. The inventive nonvolatile semiconductor memory device may be incorporated into large-scale integrated circuits (LSIs) for microcomputers and IC cards, for example. Therefore, the present invention is effective in providing security for personal information and programs for operating microcomputers, for example.

Further, the inventive nonvolatile semiconductor memory device may be provided in electronic equipment. Conceivable examples of the electronic equipment include DVD (Digital Versatile Disc), DVC (Digital Video Camera), PDA (Personal Digital Assistant), cellular phone (mobile telephone), and personal computer (notebook computer, and desktop computer).

Furthermore, the inventive method for providing security may be employed in the case where data is read into a CPU (Central Processing Unit) from a memory and program manipulation is executed by the CPU. In such an embodiment, the inventive method for providing security is also effective in the program manipulation.

As described above, in the inventive nonvolatile semiconductor memory device and the inventive method for providing security for the device, a security circuit that is large in circuit size does not have to be additionally provided. Thus, the nonvolatile semiconductor memory device with the security function can be provided at a low cost while reducing the area of the device. Accordingly, the present invention is extremely effective in reducing the size and cost of LSIs and electronic equipment.

Finally, the inventive nonvolatile semiconductor memory device and the inventive method for providing security for the device are not limited to the above-described embodiments. The present invention is also effective where it is applied to devices that are variously modified, so long as the modification does not depart from the scope of the present invention. For example, although the foregoing embodiments have been described on the supposition that the present invention is applied to a NOR flash memory, the present invention may also be applied to DINOR, NAND and AND flash memories. Furthermore, although the foregoing embodiments have been described on the supposition that the present invention is applied to flash memories, the present invention may also be applied to other nonvolatile semiconductor memory devices (such as EEPROM and FeRAM). Besides, although the foregoing embodiments have been described by taking, as an example, the memory device configured as shown in FIG. 1, the present invention may also be applied to memory devices that are configured differently. The foregoing embodiments have been described by taking, as an example, the column latch circuit configured as shown in FIG. 5. Alternatively, the present invention may also be applied to differently configured column latch circuits that are used for page latching, programming and verifying operations.

What is claimed is:

1. A nonvolatile semiconductor memory device comprising:
a memory cell array including a plurality of main memory cells arranged in rows and columns to form a matrix;
a plurality of word lines each connected to the main memory cells arranged in the associated row in the memory cell array;
a plurality of bit lines each connected to the main memory cells arranged in the associated column in the memory cell array;
a column latch circuit, connected to associated one or more of the bit lines, for performing a latching operation for latching therein data to be written in the main memory cells, and for performing a verifying operation for determining whether the latched data is identical to the data written in the main memory cells;
a plurality of deactivation code storing memory cells for storing a security function deactivation code for permitting access to the memory cell array from outside; and
a control section for allowing, when a password for deactivating a security function has been inputted, the column latch circuit to latch the password, and for performing a verifying operation for determining whether the latched password is identical to the security function deactivation code stored in the deactivation code storing memory cells.

2. The nonvolatile semiconductor memory device according to claim 1, wherein access to the memory cell array from outside is permitted by the control section when it is determined that the password is identical to the security function deactivation code as a result of the verifying operation.

3. The nonvolatile semiconductor memory device according to claim 1, wherein the security function is set when power is turned on.

4. The nonvolatile semiconductor memory device according to claim 1, wherein the memory device further comprises a detection section for detecting input of a security function deactivation command, and
wherein when the security function deactivation command is detected by the detection section, the control section starts the latching operation and verifying operation for security authentication.

5. The nonvolatile semiconductor memory device according to claim 4, further comprising a register for arbitrarily setting the security function deactivation command detected by the detection section.

6. The nonvolatile semiconductor memory device according to claim 1, wherein the memory device further comprises a detection section for detecting input of at least a specified address or specified data, and
wherein when at least a specified address or specified data is detected by the detection section, the control section starts the latching operation and verifying operation for security authentication.

7. The nonvolatile semiconductor memory device according to claim 6, wherein the detection section performs detection when power is turned on.

8. The nonvolatile semiconductor memory device according to claim 6, wherein the detection section performs detection when a reset mode is deactivated.

9. The nonvolatile semiconductor memory device according to claim 6, wherein the detection section performs detection before the start of the latching operation for latching the password in the column latch circuit.

10. The nonvolatile semiconductor memory device according to claim 6, further comprising a register for arbitrarily setting the specified address and specified data that are detected by the detection section.

11. The nonvolatile semiconductor memory device according to claim 1, wherein the memory device further comprises a prohibited data detection section for detecting that the password is prohibited data, and wherein when the prohibited data is detected by the prohibited data detection section, access to the memory cell array from outside is disabled by the control section.

12. The nonvolatile semiconductor memory device according to claim 11, wherein no bit having programmed-state data exists in the prohibited data.

13. The nonvolatile semiconductor memory device according to claim 11, wherein when all bits of a password are organized into a group or are divided into two or more groups, the prohibited data has a group of bits in which no programmed-state data exists.

14. The nonvolatile semiconductor memory device according to claim 1, wherein the memory device further comprises a detection section for detecting input of a specified address before the operation of latching a password in the column latch circuit, and wherein when input of a specified address is not detected by the detection section, access to the memory cell array from outside is disabled by the control section.

15. The nonvolatile semiconductor memory device according to claim 14, further comprising a register for arbitrarily setting the specified address detected by the detection section.

16. The nonvolatile semiconductor memory device according to claim 1, wherein the memory device further comprises a detection section for detecting input of at least a specified address or specified data before the verifying operation for determining whether the password is identical to the security function deactivation code stored in the deactivation code storing memory cells, and wherein when input of at least a specified address or specified data is not detected by the detection section, access to the memory cell array from outside is disabled by the control section.

17. The nonvolatile semiconductor memory device according to claim 16, further comprising a register for arbitrarily setting the values of the specified address and specified data that are detected by the detection section.

18. The nonvolatile semiconductor memory device according to claim 1, further comprising a data scrambling circuit for scrambling the password and for outputting the scrambled password to the column latch circuit before the control section allows the latching operation.

19. The nonvolatile semiconductor memory device according to claim 1, further comprising latch reset means for resetting data latched in the column latch circuit when it is determined that the password is not identical to the security function deactivation code during the verifying operation of the control section.

20. The nonvolatile semiconductor memory device according to claim 1, wherein the deactivation code storing memory cells are arranged in the memory cell array; and wherein the memory device further comprises a register for arbitrarily setting the addresses of the deactivation code storing memory cells in the memory cell array.

21. The nonvolatile semiconductor memory device according to claim 1, wherein a reference threshold voltage during the verifying operation that is performed on the deactivation code storing memory cells is different from a reference threshold voltage during the verifying operation that is performed when data is written.

22. The nonvolatile semiconductor memory device according to claim 1, wherein when the security function deactivation code is written in the deactivation code storing memory cells, the threshold values of programmed-state data and erased-state data in the deactivation code storing memory cells are both set in a programmed threshold voltage range or an erased threshold voltage range for the main memory cell, and wherein the security function deactivation code is written in the deactivation code storing memory cells with the threshold values of the programmed-state data and erased-state data of the deactivation code storing memory cells set at different values.

23. A method for providing security for a nonvolatile semiconductor memory device, wherein the nonvolatile semiconductor memory comprising:

a memory cell array including a plurality of main memory cells arranged in rows and columns to form a matrix;

a plurality of word lines each connected to the main memory cells arranged in the associated row in the memory cell array; a plurality of bit lines each connected to the main memory cells arranged in the associated column in the memory cell array;

a column latch circuit, connected to associated one or more of the bit lines, for performing a latching operation for latching therein data to be written in the main memory cells, and for performing a verifying operation for determining whether the latched data is identical to the data written in the main memory cells; and a plurality of deactivation code storing memory cells for storing a security function deactivation code for permitting access to the memory cell array from outside, and the method comprising the steps of:

(a) latching, when a password for deactivating the security function has been inputted, the password in the column latch circuit; and (b) performing the verifying operation for determining whether the password latched in the step (a) is identical to the security function deactivation code stored in deactivation code storing memory cells.

24. The method for providing security according to claim 23, wherein if it is determined that the password is identical to the security function deactivation code in the step (b), access to a memory cell array from outside is permitted.

* * * * *